US009578731B2

(12) United States Patent
Van Zyl

(10) Patent No.: US 9,578,731 B2
(45) Date of Patent: Feb. 21, 2017

(54) SYSTEMS AND METHODS FOR OBTAINING INFORMATION ABOUT A PLASMA LOAD

(71) Applicant: Advanced Energy Industries, Inc., Fort Collins, CO (US)

(72) Inventor: Gideon Van Zyl, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

(21) Appl. No.: 14/885,455

(22) Filed: Oct. 16, 2015

(65) Prior Publication Data

US 2016/0113103 A1 Apr. 21, 2016

Related U.S. Application Data

(60) Provisional application No. 62/064,833, filed on Oct. 16, 2014.

(51) Int. Cl.
*H05H 1/46* (2006.01)
*H01J 37/32* (2006.01)

(52) U.S. Cl.
CPC .......... *H05H 1/46* (2013.01); *H01J 37/32082* (2013.01); *H01J 37/32155* (2013.01); *H01J 37/32174* (2013.01); *H01J 37/32935* (2013.01); *H05H 2001/4682* (2013.01)

(58) Field of Classification Search
None
See application file for complete search history.

(56) References Cited

U.S. PATENT DOCUMENTS

| | | | | |
|---|---|---|---|---|
| 6,958,630 | B2 * | 10/2005 | Watanabe | G01R 23/145 315/111.21 |
| 7,477,711 | B2 | 1/2009 | Kalvaitis et al. | |
| 7,602,127 | B2 * | 10/2009 | Coumou | H01J 37/32082 118/723 I |
| 7,839,223 | B2 | 11/2010 | Van Zyl | |
| 8,040,068 | B2 | 10/2011 | Coumou et al. | |
| 8,576,013 | B2 | 11/2013 | Coumou | |
| 8,674,606 | B2 | 3/2014 | Carter et al. | |
| 8,781,415 | B1 | 7/2014 | Coumou et al. | |
| 8,952,765 | B2 | 2/2015 | Fisk, II et al. | |
| 9,041,471 | B2 | 5/2015 | Coumou | |
| 9,214,901 | B2 | 12/2015 | Owen | |
| 9,294,100 | B2 | 3/2016 | Van Zyl | |
| 2006/0066247 | A1 * | 3/2006 | Koshiishi | H01J 37/32018 315/111.21 |
| 2006/0262889 | A1 | 11/2006 | Kalvaitis et al. | |
| 2010/0194195 | A1 | 8/2010 | Coumou et al. | |
| 2013/0169359 | A1 | 7/2013 | Coumou | |
| 2014/0028389 | A1 | 1/2014 | Coumou | |
| 2014/0028398 | A1 | 1/2014 | Owen | |

(Continued)

*Primary Examiner* — Douglas W Owens
*Assistant Examiner* — Dedei K Hammond
(74) *Attorney, Agent, or Firm* — Neugeboren O'Dowd PC

(57) ABSTRACT

A power generation system and method for identifying characteristics of a plasma load are disclosed. The power generation system may include a power source configured to apply a primary power signal at a primary frequency to an output and one or more secondary power signals at one or more secondary frequencies to the output. A sensor is arranged to monitor a characteristic of the power delivered to the plasma load, and an identification module analyzes the monitored characteristic to extract characteristics of the plasma load.

24 Claims, 19 Drawing Sheets

(56) References Cited

U.S. PATENT DOCUMENTS

2014/0062305 A1    3/2014   Klein et al.
2014/0097908 A1    4/2014   Fisk, II et al.
2014/0155008 A1    6/2014   Van Zyl
2014/0220913 A1    8/2014   Coumou et al.
2015/0270104 A1    9/2015   Van Zyl

* cited by examiner

SYSTEMS AND METHODS FOR OBTAINING INFORMATION ABOUT A PLASMA LOAD

CLAIM OF PRIORITY UNDER 35 U.S.C. §119

The present application for patent claims priority to Provisional Application No. 62/064,833 entitled "NOISE BASED FREQUENCY TUNING AND IDENTIFICATION OF PLASMA CHARACTERISTICS" filed Oct. 16, 2014 and assigned to the assignee hereof and hereby expressly incorporated by reference herein.

FIELD OF THE DISCLOSURE

The present disclosure relates generally to frequency tuning a generator. In particular, but not by way of limitation, the present disclosure relates to systems, methods and apparatuses for frequency tuning a generator in a plasma processing system and the identification of plasma characteristics or changes in plasma characteristics.

BACKGROUND

Automated frequency tuning often seeks to match a load impedance presented to a generator to an impedance into which a generator is designed to deliver power. In some instances this can be accomplished by minimizing the magnitude of a load reflection coefficient, ρ, defined as $$\rho = \frac{Z - Z_0}{Z + Z_0^*} \qquad \text{Equation (1)}$$

where Z is the load impedance presented to the generator, $Z_0$ is the desired load impedance and * indicates taking the complex conjugate. In many applications $Z_0 = Z_0^* = 50\Omega$.

Automated tuning algorithms sometimes gravitate to a local optimum and thereby miss a global optimum. FIG. 8 illustrates a plot of a measure of performance (e.g. reflected power or load reflection coefficient magnitude) as a function of frequency showing a local minimum at $f_1$ and a global minimum at $f_0$. In this illustration finding the optimum is equivalent to finding the minimum of the measure of performance. One can see that if the automated frequency tuning begins at a lower frequency than $f_a$, then the algorithm is likely to settle in the local minimum at $f_1$ and be unaware of the global minimum at $f_0$.

For simple loads it is possible to simply sweep the frequency over the entire frequency range to find the global optimum at $f_0$. In plasma applications such an approach to finding the global optimum frequency is often not an option. One potential problem is that as the frequency is swept, frequencies such as $f_a$ in FIG. 8, may be encountered where the load impedance is badly mismatched to the impedance into which the generator can deliver power. If the generator frequency dwells for any amount of time at such a frequency where the generator cannot deliver sufficient power into the load, the plasma may extinguish. If short periods of high reflected power are acceptable, then a technique of probing the entire frequency range by changing frequency for only a short period of time in order to probe different frequencies may be an acceptable solution to finding the global optimum frequency. However, in some applications even these short duration plasma disturbances are not acceptable. A solution for finding the global optimum with minimal disturbance of the plasma load is desired. In many applications finding the optimum operating frequency is equivalent to minimizing the load impedance mismatch, but other factors such as stability of the plasma system and efficiency of the system may factor into the optimality of a frequency.

SUMMARY OF THE DISCLOSURE

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

An aspect may be characterized as a power generation system configured for identifying characteristics of a plasma load. The power generation system includes a power source configured to apply a primary power signal at a primary frequency to an output and concurrently applying one or more secondary power signals at one or more secondary frequencies to the output. The power produced at the secondary frequencies is lower than power produced at the primary frequency. A sensor is arranged to monitor a characteristic of the power delivered to the plasma load, and the system includes an identification module that analyzes the monitored characteristic to extract characteristics of the plasma load.

Another aspect may be characterized as a power generation system configured for identifying characteristics of a plasma load. The power generation system includes a power source to apply a primary power signal and one or more secondary power signals at one or more secondary frequencies to the plasma load, wherein power produced at the secondary frequencies is lower than power produced at the primary frequency. A sensor is arranged to sense power delivered to the plasma load, and an identification module is configured to provide information about the plasma load. The identification module includes a non-transitory, tangible machine readable storage medium, encoded with instructions to perform a method for providing the information about the plasma load. The method includes applying the primary power signal at a primary frequency to the plasma load and concurrently applying the one or more secondary power signals at one or secondary frequencies to the plasma load. The monitored characteristic is then analyzed to extract characteristics of the plasma load.

BRIEF DESCRIPTION OF THE DRAWINGS

Various objects and advantages and a more complete understanding of the present invention are apparent and more readily appreciated by referring to the following detailed description and to the appended claims when taken in conjunction with the accompanying drawings:

DETAILED DESCRIPTION

Figure 1:
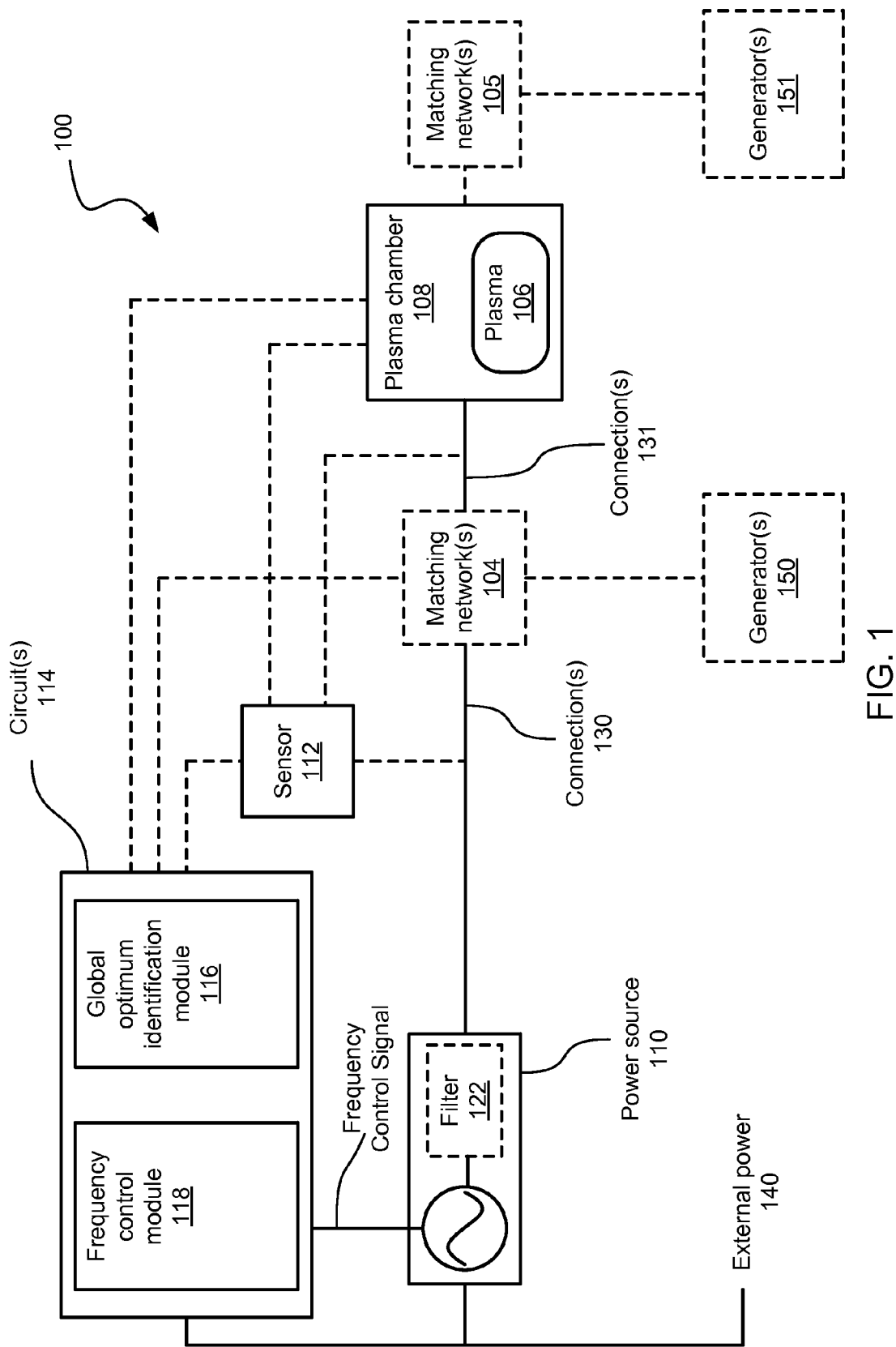
FIG. 1 illustrates a power generation system configured for automated frequency tuning of power delivered to a plasma load.

The word "exemplary" is used herein to mean "serving as an example, instance, or illustration." Any embodiment described herein as "exemplary" is not necessarily to be construed as preferred or advantageous over other embodiments.

For the purposes of this disclosure, a "low level signal" is one that is substantially lower than a primary signal being delivered to a plasma chamber, for instance at least an order of magnitude smaller.

For the purposes of this disclosure, a "circuit" can include any combination of electrical components that generate an output signal based on an input signal. A circuit can be digital, analog, or part of or comprising a processor or central processing unit (CPU). A circuit can include, or can read from, a non-transitory, tangible computer readable storage medium with processor readable instructions for performing the methods described below.

For the purposes of this disclosure, components can be in communication, which in some cases includes electrical communication (e.g., able to send signals therebetween) However, one of skill in the art will recognize that communication can also include optical and wireless radio communications, to name two non-limiting examples.

For the purposes of this disclosure, a "global optimum" can include a minimum or maximum value for a characteristic as sampled across a range of frequencies. For instance, where reflected power is the characteristic, the global optimum can be a global minimum, while where delivered power is the characteristic, the global optimum can be a global maximum.

The present disclosure relates generally to a power generator system configured to generate and apply (in addition to plasma-sustaining power at a primary frequency) a secondary power signal (e.g., including one or more frequencies) that is much lower in power than the plasma-sustaining power. Beneficially, the application of the secondary power signal enables one or more aspects of the plasma load to be monitored without adversely affecting the plasma load itself. In addition, when the plasma-sustaining power is applied to a plasma load via a match network, the application of the low level signal may be applied with one or more particular frequencies that result in detectable frequencies (e.g., mixing and intermodulation frequencies) that are passed by the narrow filtering band of the match network. Moreover, information obtained about the plasma load may be used to control one or more aspects of the generator.

In terms of generator control for example, automated frequency tuning may be performed using the information about the plasma load. In particular, a global optimum of some measure of performance may be obtained, and the generator may be adjusted towards this global optimum frequency—without extinguishing the plasma. Two exemplary approaches include: (1) processing noise generated by the primary operating frequency of a generator in order to effectively perform a low-power sampling sweep of an interested frequency range; or (2) generating a low power signal in addition to the primary power signal, where the low power signal is used to scout for the global optimum.

In both cases, the low power nature of the noise or the scouting signal enables exploration of a frequency range while the primary power signal of the generator remains at a frequency (e.g., at a local optimum of the measure of performance) where sufficient power can be delivered to the plasma load to sustain the plasma. For instance, the primary power signal can remain at or near a local optimum while the scouting signal or noise (both will be hereafter referred to as a "secondary power signal") finds the global optimum thereby continuing to allow substantial power to reach the plasma load while the scouting occurs.

In the case where the secondary power signal is noise, the noise can either be inherent noise generated as a result of the primary power signal, or the noise can be added to the primary power signal. The noise can occur at a plurality of secondary frequencies sometimes limited to a bandwidth governed by a filter applied to the primary power signal. Where the secondary power signal is a low-level signal, such a signal can be orders of magnitude lower than an amplitude of the primary power signal (e.g., −3 dB, −5 dB, −10 dB, −20 dB, −50 dB, −100 dB). The low-level signal can be sinusoidal or any other type of periodic signal and can be generated at RF or other frequencies. Signals that start at a finite time and eventually become sinusoidal or periodic are considered to be sinusoidal or periodic, respectively. The low-level signal can be swept across a fixed range of secondary frequencies. Alternatively, the low-level signal can 'hop' between secondary frequencies according to a tuning algorithm that searches for a global optimum.

A global optimum may be found by comparing the optimality of different frequencies and choosing the most optimal frequency. For example, if the measure of optimality is the smallest load reflection coefficient magnitude, then the estimated load reflection coefficient magnitude at the different frequencies scouted by secondary power signal source are compared and the frequency at which the load reflection coefficient is the smallest is chosen as the global optimum frequency. The measuring and comparing to find the optimum can occur sequentially or, e.g., in the case where noise is used as the secondary power signal, the optimality of different frequencies can be computed simultaneously and the most optimal frequency chosen after the computation at the different frequencies.

Once the global optimum has been found, the primary power signal can be shifted to a frequency of the global optimum. Such shifting can involve a sudden switch from one frequency to another or can involve a power to the secondary power signal being ramped up while power to the primary power signal is ramped down such that the secondary power signal becomes the primary power signal.

Once the primary power signal is operating at a frequency of the global optimum, further fine tuning can occur. For instance, the secondary power signal can again go out in search of the global optimum, either because the global optimum at the power level of the primary power signal is different than a global optimum for the lower power of the secondary power signal, or because the global optimum varies and has changed since the first iteration of tuning occurred.

FIG. 1 illustrates a power generation system configured for automated frequency tuning of power delivered to a plasma load. The power generation system 100 is configured to provide radio frequency (RF) power to the plasma 106 or plasma load via RF impedance matching circuits which can be an optional filter 122 internal to the power source 110 and/or a matching network 104 external to the power source 110. Filtering and impedance matching are frequently done by the same physical network. Hence a filter such as optional filter 122 can perform the function of both filtering and impedance matching.

The power generation system 100 can include a power source 110 that converts external power 140 to RF power and the power source 110 may be a 13.56 MHz generator, but this is certainly not required. Other frequencies and other power sources 100 are contemplated. The power generation system 100 is configured to provide RF power (e.g., an RF voltage) at a sufficient level to ignite and sustain a plasma 106 that is contained in the plasma chamber 108. The plasma 106 is generally used to process a work piece or substrate (not shown) but is well known to those skilled in the art.

The power source 110 can apply a primary power signal primarily at a primary frequency to an output. The output can be configured for coupling to an optional matching network 104 and to a plasma chamber 108. In particular, the primary power signal can be delivered to a plasma 106 or to a load of the plasma 106 (also known as the plasma load). The connection(s) 130 from the power source 110 to the optional matching network 104 are frequently coaxial cables, although other cable types and connection types are also possible. The connections(s) 131 from the matching network 104 to the plasma chamber 108 are frequently made via custom coaxial connectors, although other cable types and connection types are also possible. In some applications there is no matching network 104 and the power source 110 is connected directly to the plasma chamber 108. In this case RF impedance matching is done internal to the power source 110 with the optional filter 122. In some applications other optional RF or DC generators 150 can be connected to the plasma chamber 108 via the optional matching network 104. In some applications other optional RF or DC generators 151 can connect to the plasma chamber 108 via other means, e.g., other optional matching networks 105. The connection of other generators to the plasma load either via the matching network(s) 104 or through other means (e.g. connected to a different electrode to deliver power to the same plasma) generally makes the frequency tuning problem more complicated. In the following descriptions the possibility of other optional generator(s) 150 and 151 and other means of connecting to the plasma (e.g. matching network(s) 105) are not excluded, but for simplicity will not be illustrated or discussed further.

The sensor 112 can monitor a characteristic indicative of generator-delivered power or delivered power capability, such as reflected power, delivered power or impedance mismatch, to name just three non-limiting examples. Further non-limiting examples of a characteristic indicative of delivered power or delivered power capability include power delivered to the matching network 104, the power reflected from the matching network 104, the power delivered to the plasma chamber 108, the load impedance seen by the power generation system 100, and a characteristic of the plasma chamber 108 such as plasma density. The sensor 112 can also monitor a characteristic indicative of stability of the plasma system such as fluctuations in load impedance. The sensor 112 can also monitor a characteristic indicative of the nonlinear nature of the plasma load such as the generation of mixing and intermodulation products.

The use of a secondary signal source to implement frequency tuning of the generator has the additional benefit that measurements of the plasma properties can be made from the generator. The optional matching network(s) 104 typically act as band pass filters. This property of the matching network(s) 104 makes it difficult to make reliable measurements of the plasma at the harmonics of the generator output frequency although such information could be useful. However, the modulation of the plasma impedance can be characterized by observing the mixing and intermodulation products that are generated by the secondary signal source. For example, if the primary signal source is at 13.56 MHz and the secondary signal source is at 13.57 MHz, one expects a mixing product at 13.55 MHz and intermodulation products at 13.56 plus multiples of 10 kHz, e.g. at 13.53, 13.54, 13.58, etc. Measuring the amplitude and phase relationship of the mixing and intermodulation products and deducing e.g. the amount of amplitude and phase modulation present can provide information about the plasma properties. The processing of the information can be done in a number of ways, from simply analyzing the time series of measurements from the sensor and performing higher order statistics on the time series to using dedicated receivers tuned to the mixing and intermodulation product frequencies to extract the amplitude and phase relationships to using any number of mathematical transformations including but not limited to the discrete Fourier transform. Monitoring the mixing and intermodulation products and detecting changes in the characteristics of the plasma indicated by e.g. the amount of phase modulation to name but one property can be useful in e.g. end-point detection in e.g. etch operations in the manufacture of semiconductors.

The sensor 112 can be a directional coupler, current-voltage sensor or other multi-port network and can monitor current and voltage or combinations of voltage and current (e.g. incident and reflected signals) between the power source 110 and matching network 104 or between the matching network 104 and the plasma chamber 108. In another non-limiting example, the sensor 112 can be an optical detector directed into the plasma chamber 108 to optically measure a density of the plasma 106. These examples in no way describe the scope or limits of the sensor 112 or the positions where the sensor 112 can be arranged, but instead demonstrate that the sensor 112 can take a variety of forms and can be coupled to the system in a variety of ways (see FIGS. 2-7 for various non-limiting examples). In addition, the sensor 112 may be a sensor or sensors that already reside in the optional matching network(s) 104 or plasma chamber 108.

Signals from the sensor 112 or sensors already residing in the matching network(s) 104 and plasma chamber 108 can be provided to the one or more circuits 114 that are also in communication with, and control, the power source 110. The one or more circuit(s) 114 can use the information from the sensor 112 and/or sensors already residing in the matching network(s) 104 and plasma chamber 108 to tune the primary and/or secondary frequencies that the power source 110 operates at to optimize delivered power to the plasma 106 or to optimize another measure of optimality such as plasma stability.

In some cases, such tuning results in operation at a local optimum (e.g., a local minimum of reflected power or a local maximum of delivered power, to name just two examples), so some tuning algorithms are able to further adjust the primary frequency in order to seek out the global optimum (e.g., via a series of fast frequency 'hops'). However, such searching can take the power through regions of the frequency spectrum that are poorly impedance matched (e.g., around $f_a$ in FIG. 8), and thus can cause delivered power to drop significantly, and in some cases can cause the plasma 106 to be extinguished (e.g., at $f_a$ in FIG. 8).

To avoid this, such searching for the global optimum can be performed by one or more secondary signals, thus enabling the high powered primary power signal to remain at a frequency (e.g., at a local optimum) where sufficient power can be delivered to the plasma 106 while the search for the global optimum proceeds. FIGS. 11-13 show plots of the monitored characteristic as a function of frequency and how a secondary power signal having substantially lower amplitude than a primary power signal can be used to search out the global optimum. These plots will be discussed in depth later once related systems and apparatuses have been described.

FIG. 1 illustrates a power generation system for automated frequency tuning of power delivered to a plasma load. A power source 110 can provide a primary power signal to a plasma load of a plasma 106 in a plasma processing chamber 108 where the impedance seen by the power source 110 is impedance matched by a matching network 104 arranged between the power source 110 and the plasma chamber 108 and by frequency tuning of the power source 110. The power source 110 can be frequency tuned in order to find optimum frequencies, typically where delivered power is optimized, but other measures of optimality may be used. Such tuning can sometimes result in the primary power signal from the power source 110 being tuned to a local optimum rather than a global optimum. In such cases, one or more secondary signals can be generated by the power source 110 and processed to identify a global optimum without having to use the primary power signal to scout out the global optimum.

Figure 4:
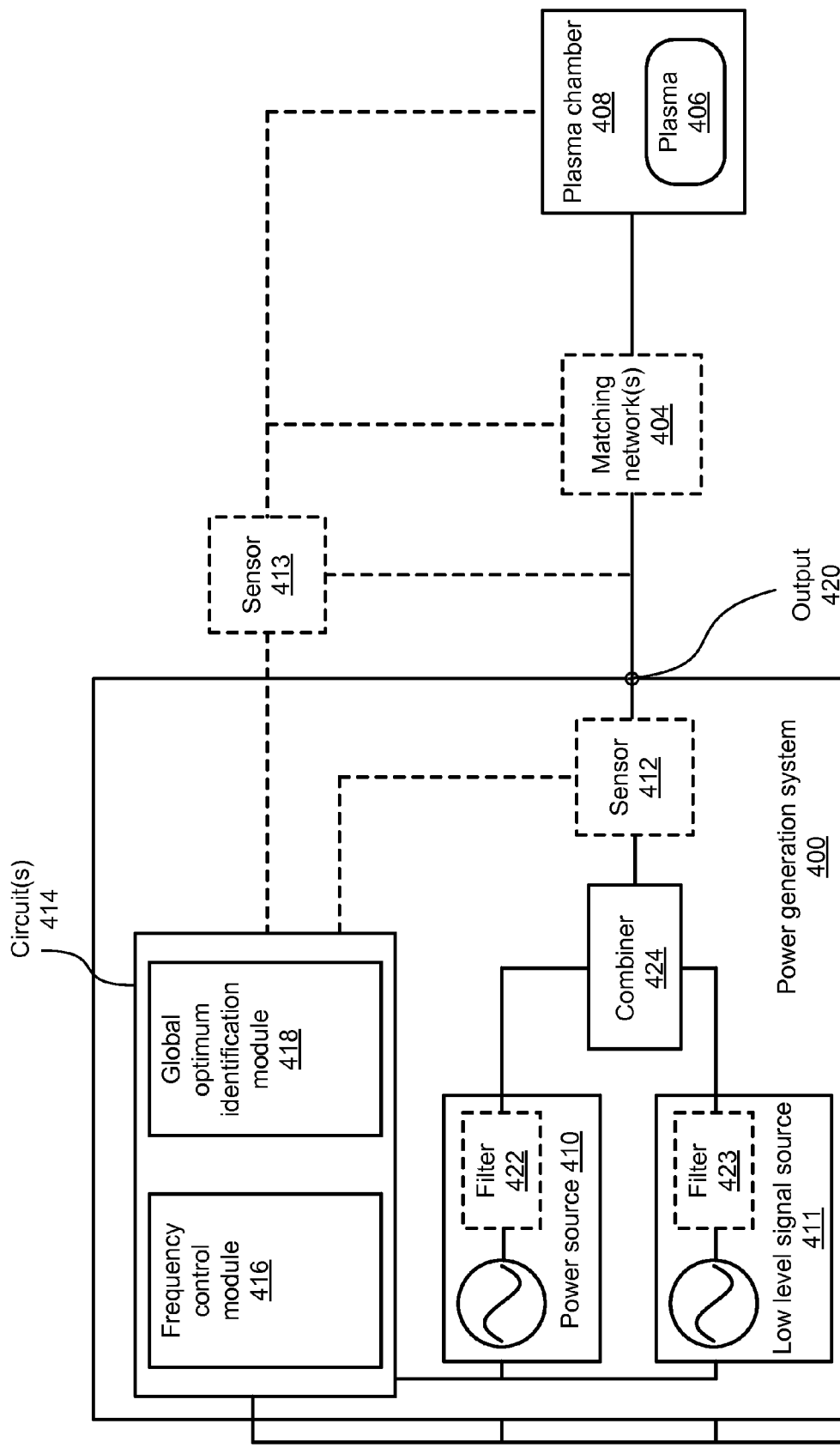
FIG. 4 illustrates a further embodiment of a power generation system.
Figure 6:
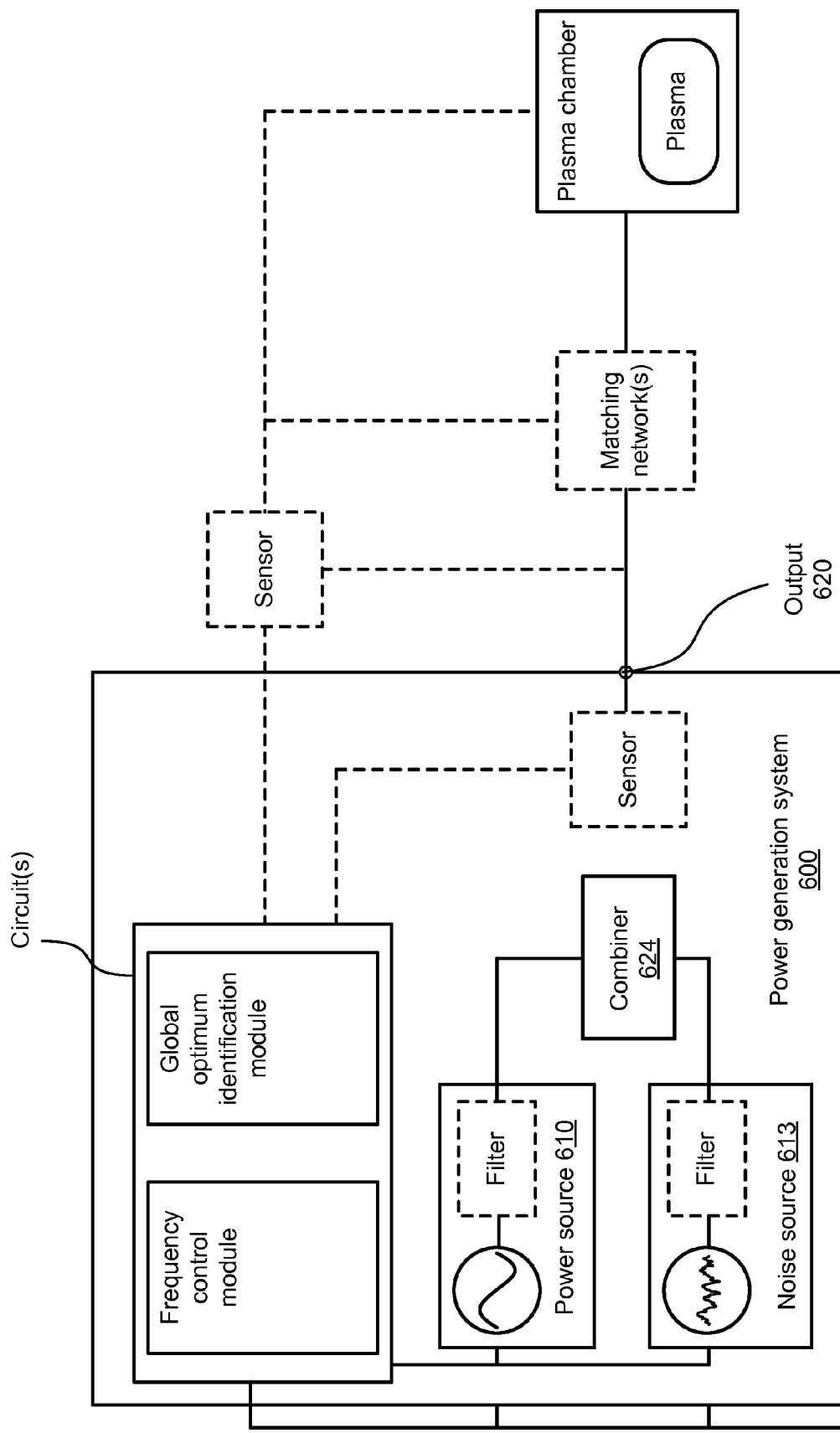
FIG. 6 illustrates an embodiment of a power generation system where the power source generates the primary power signal and a noise source generates the secondary power signal in the form of noise.

In other cases, a secondary power source can provide the secondary power signal (for example, see FIGS. 4 and 6). The one or more secondary power signals can be provided at an amplitude or power level below that of the primary power signal (or substantially below the primary power signal, a fraction of the primary power signal, or at such a substantially lower power level as to have a negligible effect on the plasma 106 as compared to the primary power signal). The one or more secondary power signals can include a plurality of secondary frequencies all generated at the same time (e.g., FIGS. 11-13). In an alternative, the one or more secondary power signals can be tuned to two or more different frequencies at different times (e.g., as depicted in FIGS. 11-13).

The one or more secondary power signals can be used to sample power delivery at frequencies other than that of the primary power signal without applying so much power at these secondary frequencies as to influence the plasma. In other words, the primary power signal can remain at a frequency where the plasma can be sustained (e.g. at or near a local optimum) while the one or more secondary power signals are used to search for the global optimum.

In particular, the sensor 112, or two or more sensors, and/or sensors already present in other components of the power generation system 100 can monitor a measure of performance at the frequency of the primary power signal as well as at the secondary frequencies. The one or more sensors (e.g., sensor 112) can also measure at the frequencies of expected mixing and intermodulation products to extract information about the nonlinear characteristics of the plasma 108. For instance, changes in the mixing and intermodulation products can be used to sense plasma ignition or end-point detection for plasma processes. The injection of a secondary frequency component or components and measurement of the properties of the mixing and intermodulation products can sense nonlinear characteristics of the plasma 108 at harmonics of the primary power signal even though the match network(s) 104 and the filter 122 may not allow direct measurement of the harmonics.

For instance, the sensor 112 can be a reflected power sensor or a delivered power sensor, and the characteristic can be reflected power or delivered power, respectively. Other characteristics can also be monitored and used to identify local and global optimums (e.g., load impedance seen by the power source 110, voltage and current of power on a supply cable 130 to the matching network(s) 104, and plasma 106 density, to name a few non-limiting examples). The sensor 112, and/or other sensors can provide information describing the characteristic(s) to one or more circuits 114 (e.g., logic circuits, digital circuits, analog circuits, non-transitory computer readable media, and combinations of the above). The one or more circuits 114 can be in communication (e.g., electrical communication) with the sensor 112 and the power source 110. The one or more circuits 114 can adjust the primary frequency of the power source 110 in order to tune the power source 110 to optimize delivered power to the plasma load.

In some embodiments, optimizing a measure of performance includes controlling a feedback loop that uses a secondary power signal in order to scout out or search for a global optimum. In such a case, the one or more circuits 114 can control the secondary power signal and its one or more secondary frequencies, based on feedback from the sensor 112 (or two or more sensors, and/or sensors already present in other components of the power generation system 100) regarding a measure of performance. For instance, a frequency of the secondary power signal can be swept across a fixed range of frequencies encompassing the primary frequency of the primary power signal, and the one or more circuits 114 can monitor a measure of performance as a function of frequencies of the secondary power signal. Based on this sweep, the one or more circuits 114 can identify a global optimum and then instruct the power source 110 to adjust its primary frequency so as to move the primary power signal to the identified global optimum. Frequency hops or other tuning schemes can be used to find the global optimum via the one or more secondary power signals.

Figure 7:
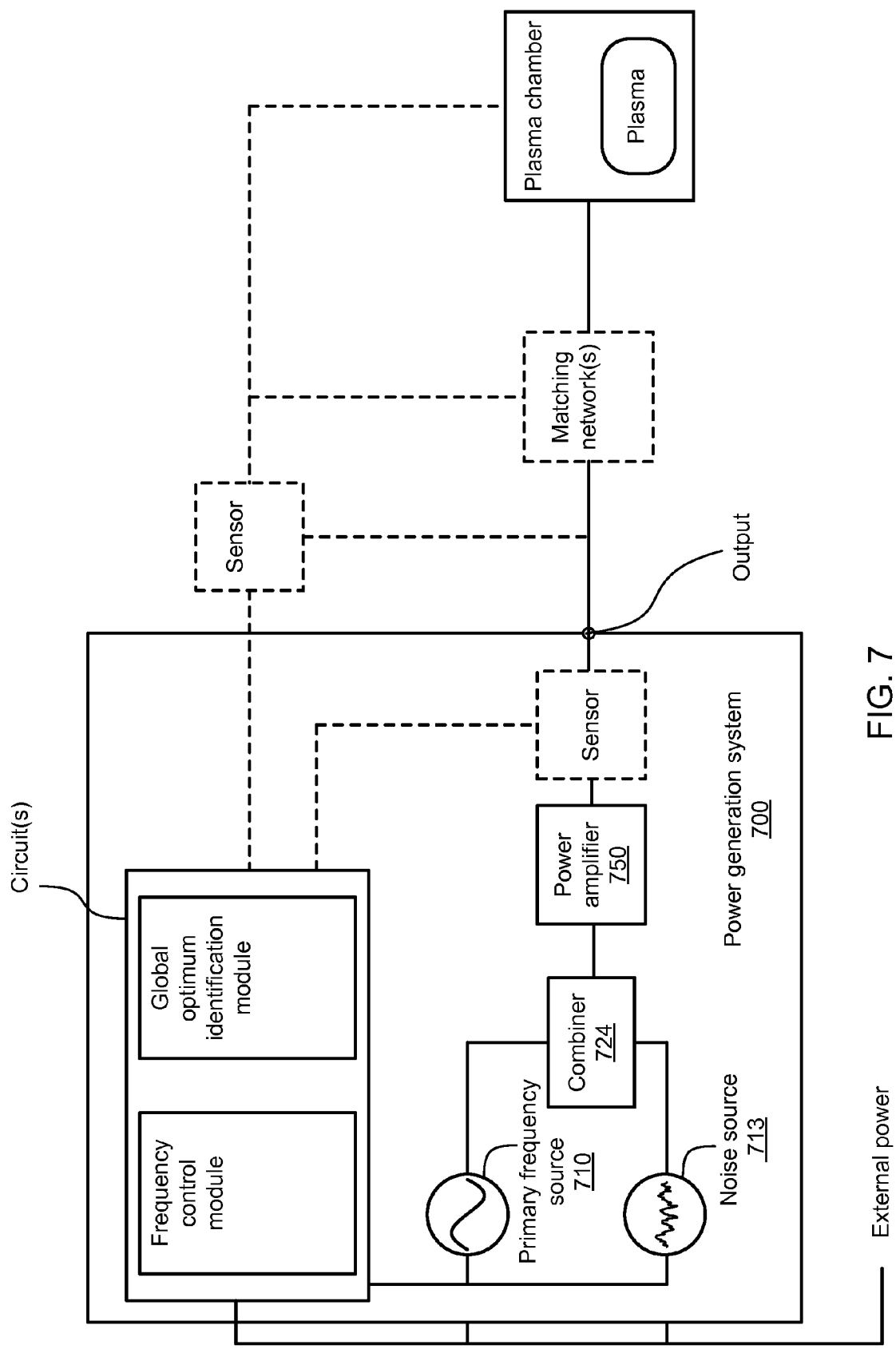
FIG. 7 illustrates an embodiment of a power generation system where the secondary signal is noise and the primary power signal and the secondary power signal are combined before amplification by a power amplifier.

The secondary power signal can take a number of different forms. In one case, the one or more circuits 114 can instruct the power source 110 to apply a secondary power signal in the form of a low level signal at the one (e.g., as depicted in FIG. 11) or more (e.g., as shown in FIG. 12) secondary frequencies, either applying a low level signal at those secondary frequencies in a particular order (e.g., FIG. 11), or according to an algorithm to optimize the measure of performance (e.g., FIG. 12). In another case, the one or more circuits 114 can instruct the power source 110 to apply a secondary power signal in the form of noise. This noise can be inherent to the primary power signal, in which case, the one or more circuits 114 do not necessarily have to supply an instruction to the power source 110, or can be non-inherent noise that is added to an output of the power source 110 (e.g., as shown in FIGS. 6 and 7).

Whatever form the secondary power signal appears in, in many embodiments, its amplitude is one or more orders of magnitude lower than that of the primary power signal. For instance, the secondary power signal can be between 1 and 100 dB lower than the primary power signal. In other embodiments, the secondary power signal can be 1 dB, 5 dB, 10 dB, 20 dB, 50 dB, or 100 dB lower than the primary power signal.

As shown the one or more circuits 114 may include a global optimum identification module 116 and a frequency control module 118. The global optimum identification module 116 can analyze the information from the sensor 112 at each of the one or more secondary frequencies and identify a frequency corresponding to a global optimum. This frequency can be referred to as an identified-global-optimum frequency and it corresponds to a global optimum of the characteristic of the generator-delivered power. The frequency control module 118 can adjust the primary frequency of the primary power signal both during initial tuning of the primary power signal, which may result in identification of a local optimum, as well as adjustment of the primary frequency towards an identified global optimum frequency once a global optimum is identified by the global optimum identification module 116.

In particular, once an identified-global-optimum frequency is identified, the frequency control module 118 can instruct the power source 110 to adjust the primary frequency to jump to the identified-global-optimum frequency, or to lower the amplitude of the primary frequency while increasing the amplitude of the secondary frequency at the identified-global-optimum frequency, so that the primary and secondary frequencies reverse roles. In this way, the primary frequency can be transitioned to a frequency corresponding to a global optimum of the power characteristic (e.g., low reflected power or low level of oscillations) without applying power in a region of the frequency spectrum that could inhibit or extinguish the plasma (e.g., around $f_a$ in FIGS. 8-13).

The operation of the global optimum identification module 116 and the frequency control module 118 can be cyclical to repeatedly improve an accuracy of adjusting the primary frequency toward a global optimum. For instance, where the characteristic (e.g., plasma impedance) being monitored is nonlinear, a global minimum for the characteristic may be found when the low level secondary power signal is applied, but when the much larger primary power signal is applied at the same frequency, a different global optimum frequency may exist for the higher powered signal. So, the secondary power signal can again be used to further hone in on a global optimum for the primary power signal and this can continue in a looping fashion for multiple iterations. Adjusting a frequency toward a global optimum can include changing the frequency to a frequency associated with the global optimum or merely changing the frequency to a frequency closer to the global optimum than to an original frequency.

In some embodiments, the primary frequency can be switched to one of the one or more secondary frequencies as soon as the one or more secondary frequencies begin to descend/ascend a steep enough portion of the frequency curves (e.g., between $f_a$ and $f_0$ in FIGS. 8-14). When such a steep portion of the curve is identified, the global optimum identification module 116 may determine that it is approaching a global optimum and thereby instruct the power source 110 to switch the primary frequency to a frequency near that of the secondary power signal, thereby enabling the primary power signal to jump over and avoid regions of the frequency curve that could inhibit the plasma (e.g., around $f_a$). Once the primary power signal switches frequency, the one or more secondary power signals can continue to hone in on the global optimum, or the primary power signal can be used to further hone in on the global optimum.

In many embodiments supply connection(s) 130 can be realized by a pair of conductors, or a collection of two-conductor coaxial cables that connect the power source 110 with the matching network 104. In other embodiments, the cable 130 is implemented with one or more twisted-pair cables. In yet other embodiments, the cable 130 may be realized by any network of cable, including, but not limited to, a simple conductor hookup and quadrapole connections. The connection(s) 131 is frequently implemented with a connector, but can also take a variety of forms including simple conductor hookup.

The matching network 104 may be realized by a variety of match network architectures. As one of ordinary skill in the art will appreciate, the matching network 104 can be used to match the load of the plasma 106 to the power source 110. By correct design of the matching network(s) 104 or 105, it is possible to transform the impedance of the load of the plasma 106 to a value close to the desired load impedance of the power source 110. Correct design of the matching network(s) 104 or 105 can include a matching network internal to the power source 110 (e.g., via filter 122) or a matching network external to the power source 110 as seen in FIGS. 1-7.

The one or more circuits 114 can be original equipment of the power generation system 100, while in other embodiments, the one or more circuits 114 can be retrofit components that can be added to a power generation system that was not originally capable of the herein described frequency tuning.

In an embodiment, the power generation system 100 can include an optional filter 122. The filter 122 can be configured to attenuate portions of the primary power signal outside of a selected bandwidth and do additional impedance matching. For example, because 50 ohm is the dominant impedance for cables and connectors 130, the desired impedance seen at the output of the power source 110 is typically 50 ohm or some other convenient impedance. The impedance at the input (at the opposite side from the output of the power source 110) of the filter 122 provides the impedance desired by the active elements of the power source (e.g. MOSFETs) and is typically very different from 50 ohm, e.g. 5+j6 ohm is typical for a single MOSFET amplifier. For such a system the filter 122 will then be designed to match 50 ohm at the output to 5+j6 ohm at the input. In addition to impedance matching the filter is also typically designed to limit harmonics generated by the active elements. E.g. the filter can be designed to match 50 ohm at the output to a value close to 5+j6 over the range of frequencies over which the generator is expected to operate, e.g. from 12.882 to 14.238 MHz and suppress signals at frequencies higher than 25 MHz by a certain amount, typically at least 20 dB at the second or third harmonic of the output.

The sensor 112 can be arranged in a variety of locations, including those that are part of the power generation system 100, and those that are external thereto. Where the sensor 112 monitors a characteristic can also vary from embodiment to embodiment, as will be seen in FIGS. 2-7.

Figure 2:
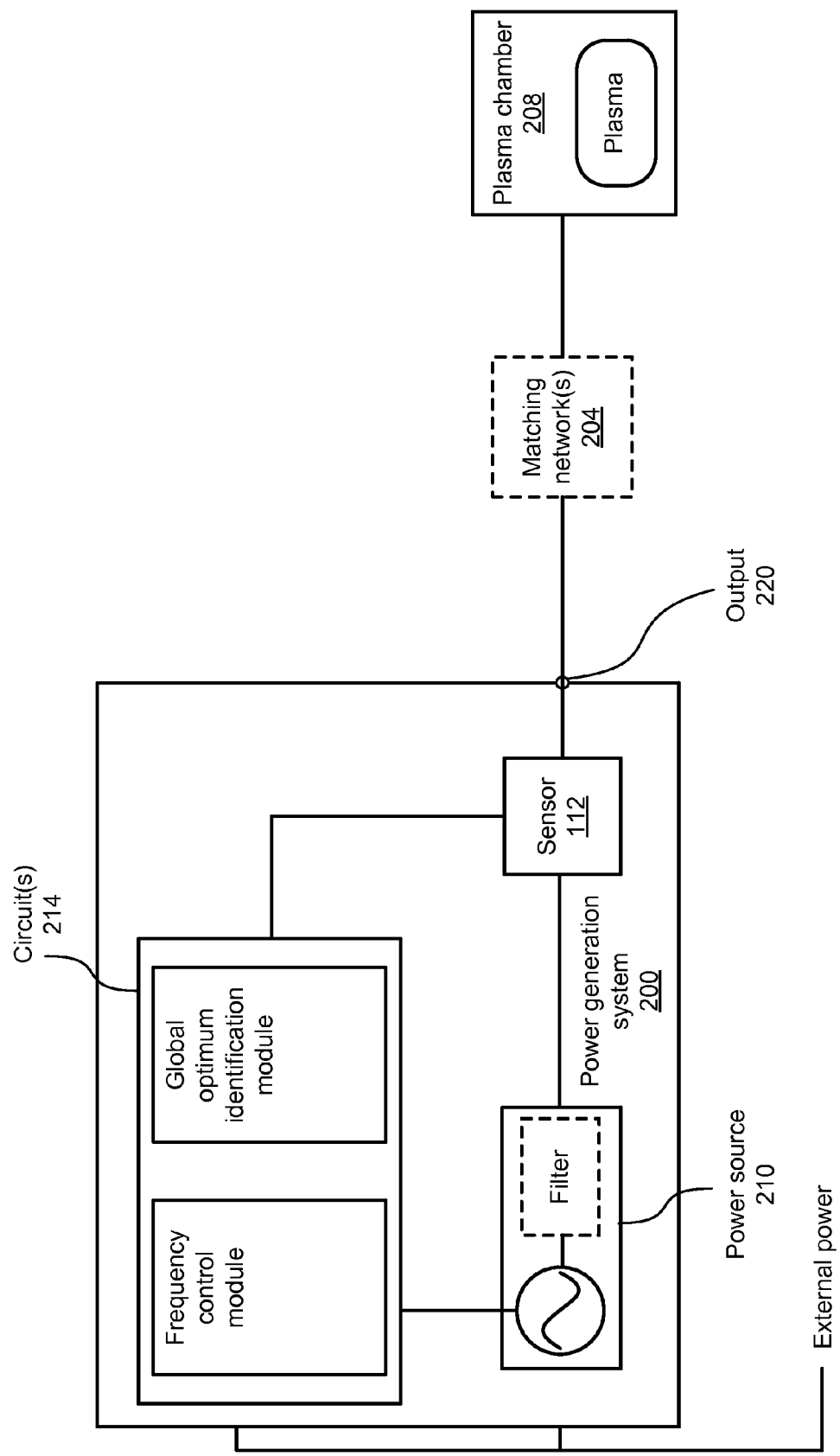
FIG. 2 illustrates one embodiment of a power generation system where the sensor resides within a power generation system along with a power source and one or more circuits.

FIG. 2 illustrates one embodiment of a power generation system 200 where the sensor 212 resides within a power generation system 200 along with a power source 210 and one or more circuits 214. The power generation system 200 includes an output 220 configured for coupling to the optional matching network(s) 204 or directly to the plasma chamber 208 if the matching network(s) 204 is not present. Thus, the primary power signal and the one or more secondary power signals can be provided to the output 220 and hence configured for delivery to the matching network(s) 204.

Figure 3:
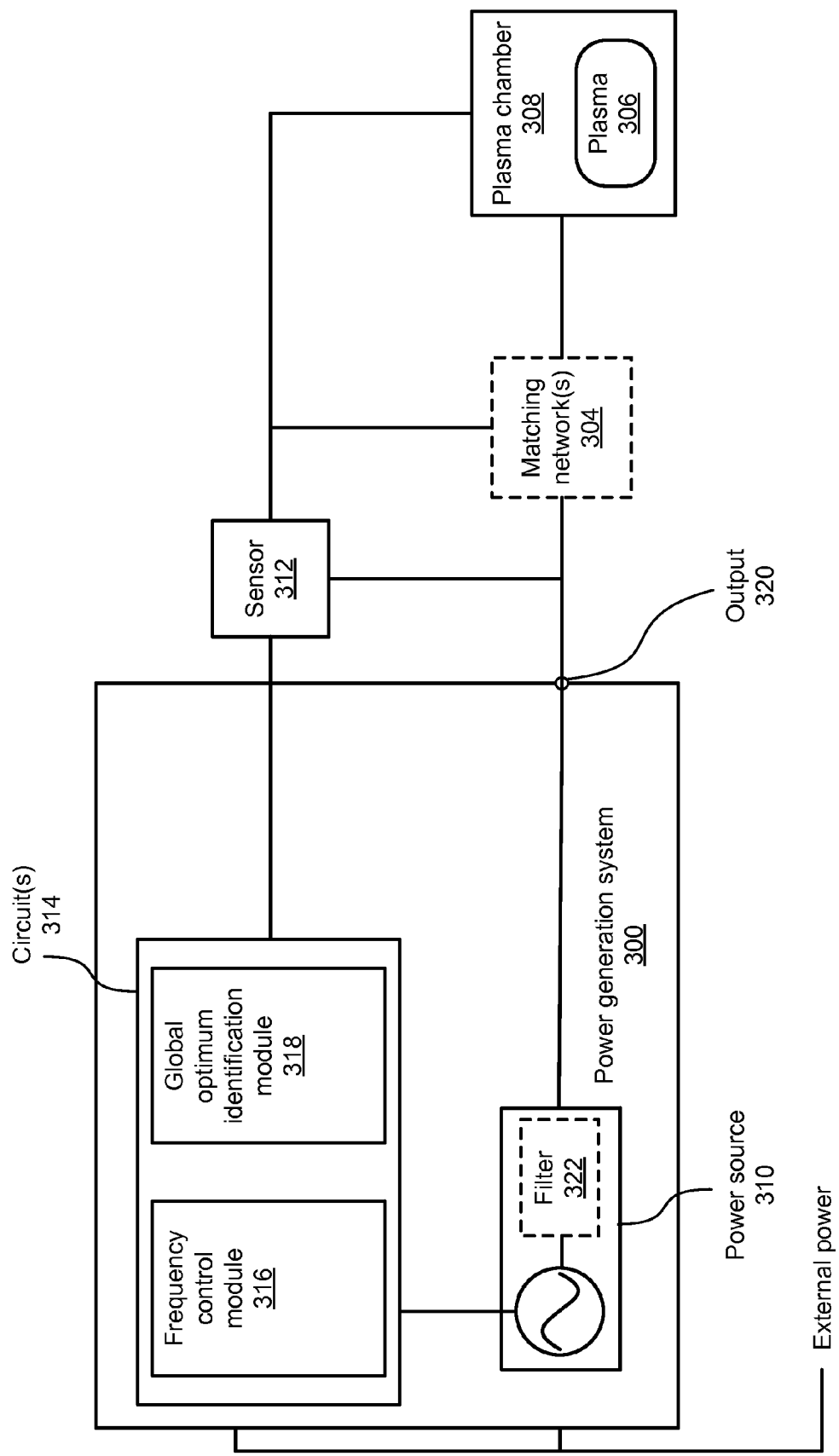
FIG. 3 illustrates one embodiment of a power generation system where a sensor resides outside the power generation system.

FIG. 3 illustrates one embodiment of a power generation system 300 where a sensor 312 resides outside the power generation system 300. Here the power generation system 300 includes the power source 310, one or more circuits 314, an optional filter 322, and an output 320 to the power generation system 300. The sensor 312 is coupled to the one or more circuits 314 and provides information describing a measure of performance (e.g. load reflection coefficient magnitude or plasma density). The sensor 312 monitors the characteristic either between the power generation system 300 and an optional matching network(s) 304, between the matching network(s) 304 and the plasma chamber 308, or at the plasma chamber 308, or between the power generation system 300 and plasma chamber 308 if the match network(s) 304 is not present. The sensor 312 could also perform monitoring at or within the matching network(s) 304.

While FIGS. 1-3 illustrate a single power source 110, 210, 310, one of skill in the art will recognize that this power source 110, 210, 310 is capable of generating both the primary and secondary power signals concurrently. For instance, the power source 110, 210, 310 can source both a high power primary power signal and a low level secondary power signal, or the power source 110, 210, 310 can source a high power primary power signal and use the noise inherent to that primary power signal as the secondary power signal, to name two non-limiting examples. Alternatively, the power source 110, 210, 310 can generate a primary power signal and combine this with generated or amplified noise. While each of these examples demonstrate how a single power source 110, 210, 310 can produce both the primary power signal and the secondary power signal, FIGS. 4-7 will illustrate embodiments where a power source generates the primary power signal and a low level signal source generates the secondary power signal.

FIG. 4 illustrates an embodiment of a power generation system 400 having a power source 410, a low level signal source 411, one or more circuits 414, an optional sensor 412 that can be arranged within the power generation system 400 or an optional sensor 413 that can be arranged outside the power generation system 400, and a combiner 424 that combines the outputs from the power source 410 and low level signal source 411. As one of ordinary skill in the art will appreciate, the combiner may be realized by a coupler known in the art.

Figure 5:
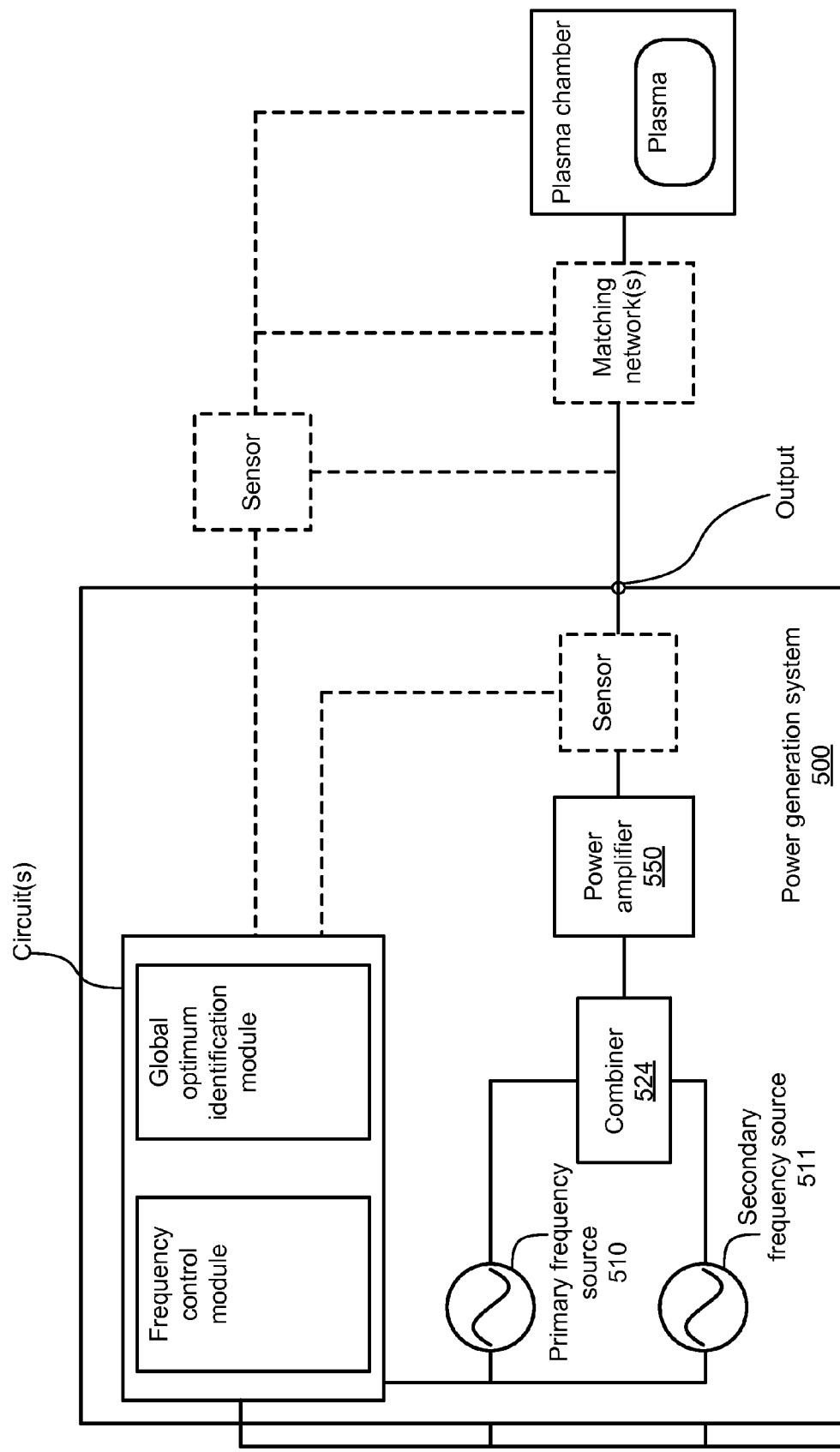
FIG. 5 illustrates an embodiment of a power generation system where the primary power signal and the secondary power signal are combined before amplification by a power amplifier.

FIG. 5 illustrates an embodiment of a power generation system 500 where the primary and secondary signals are combined before being amplified by a power amplifier 550.

FIG. 6 illustrates an embodiment of a power generation system 600 where the power source 610 generates the primary power signal and a noise source 613 generates the secondary power signal in the form of noise. The primary power signal and the secondary power signal, or noise, can be combined in the power generation system 600 and the combined signal can be provided to an output 620 of the power generation system 600. As one of ordinary skill in the art will appreciate the noise source 613 may be realized by a variety of different types of devices include a noise diode. Beneficially, the noise source 613 may generate a continuum of secondary frequencies, and the response of the secondary frequencies may be processed in parallel at a plurality of different frequencies (e.g., by a plurality of demodulating channels or fast Fourier transform module(s)). For example, a reflection coefficient at the plurality of frequencies may be arrived at in parallel to identify a frequency that provides a low reflection coefficient, a stable frequency, or a balance between stability and a low reflection coefficient.

FIG. 7 illustrates an embodiment of a power generation system 700 where the primary and secondary signals are combined before being amplified by a power amplifier 750. In this embodiment, the secondary signal is generated by a noise source 713.

The systems illustrated in FIGS. 1-7 can be more easily understood with reference to the plots seen in FIGS. 8-15.

Figure 8:
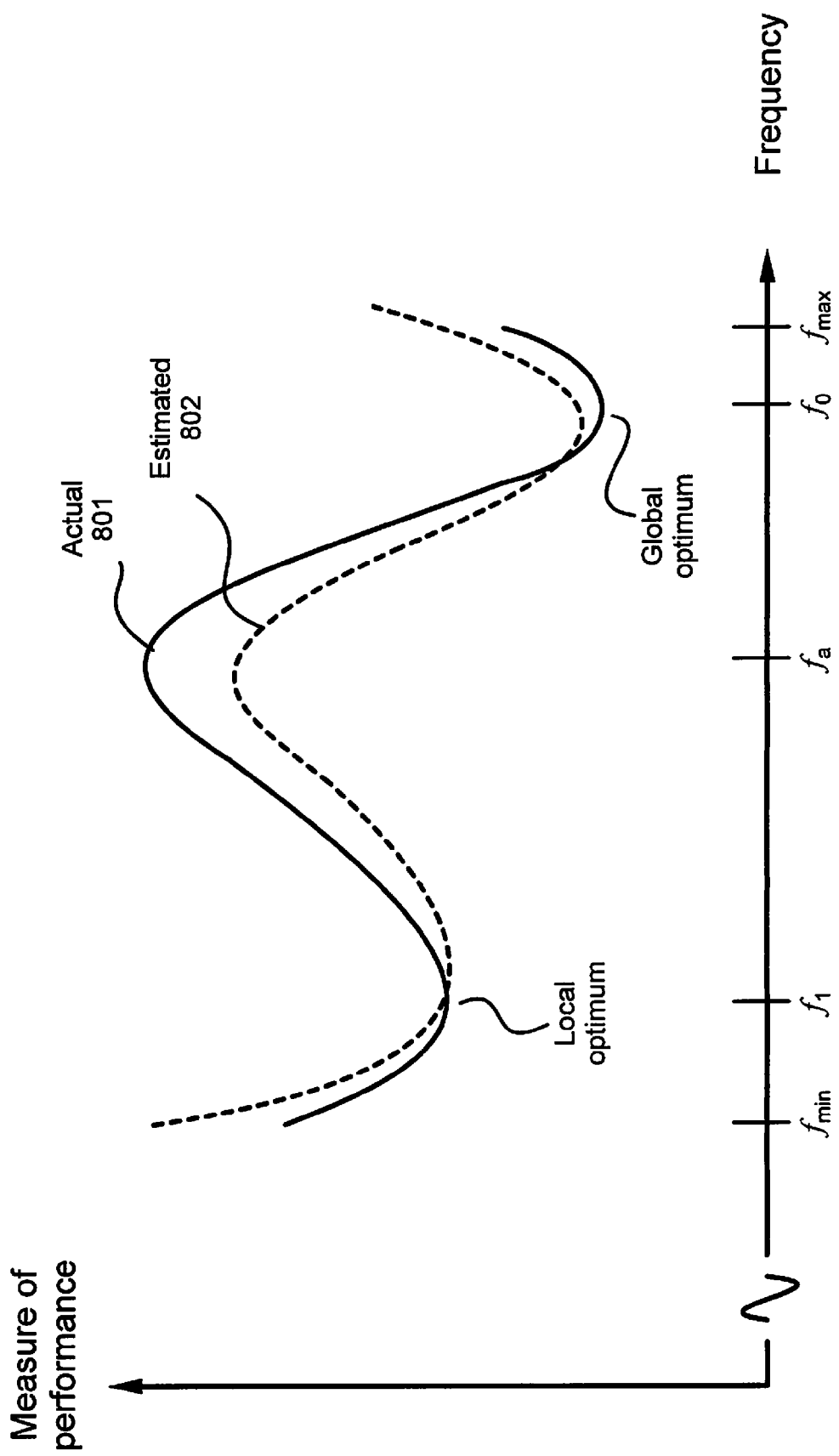
FIG. 8 shows a plot of a measure of performance as a function of frequency.

FIG. 8 shows a plot of a measure of performance as a function of the frequency. The solid line 801 shows the actual measure of performance (e.g., load reflection coefficient magnitude) as a function of frequency that would result if the primary power signal were adjusted to each frequency and the measurement made. The dotted line, 802, shows the estimated measure of performance obtained using a secondary power signal or signals while the primary power signal remains at a fixed frequency (e.g., $f_1$).

As discussed, the power level of the primary frequency affects the measure of performance (e.g., load reflection coefficient); thus the measure of performance that is estimated using low-level power signals will differ from the measure of performance at the higher power of the primary signal. But as discussed further herein, the low level signals enable the desired primary frequency (e.g., that produces a low reflection coefficient and/or low instabilities) to be closely estimated. The frequency of the primary signal may then be fine-tuned at the higher power level without testing frequencies that may result in the plasma being extinguished.

Figure 9A:
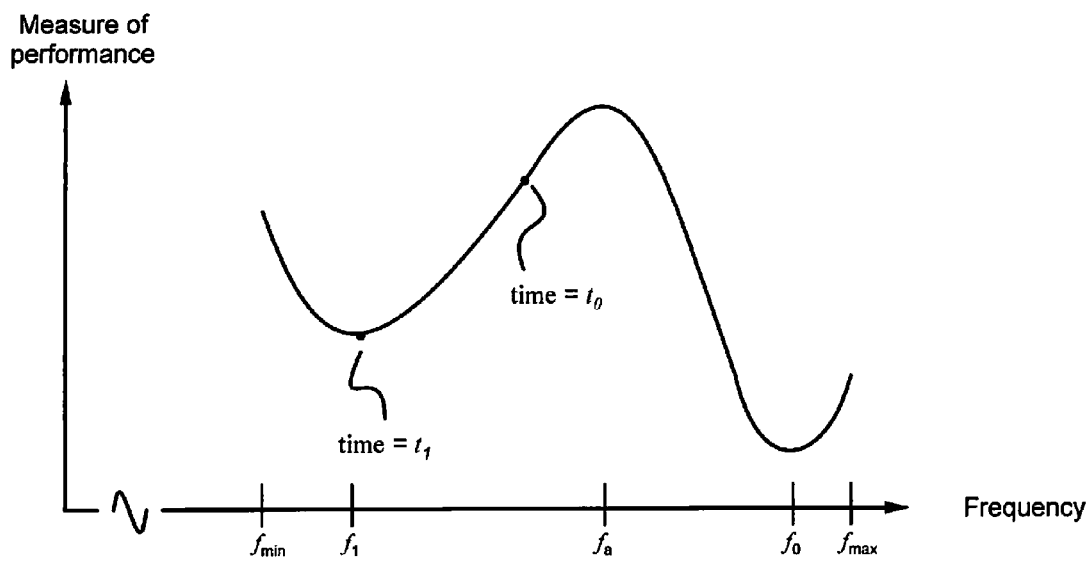
FIG. 9A is a graph depicting a measure of performance (e.g., reflection coefficient) as a function of frequency.
Figure 9B:
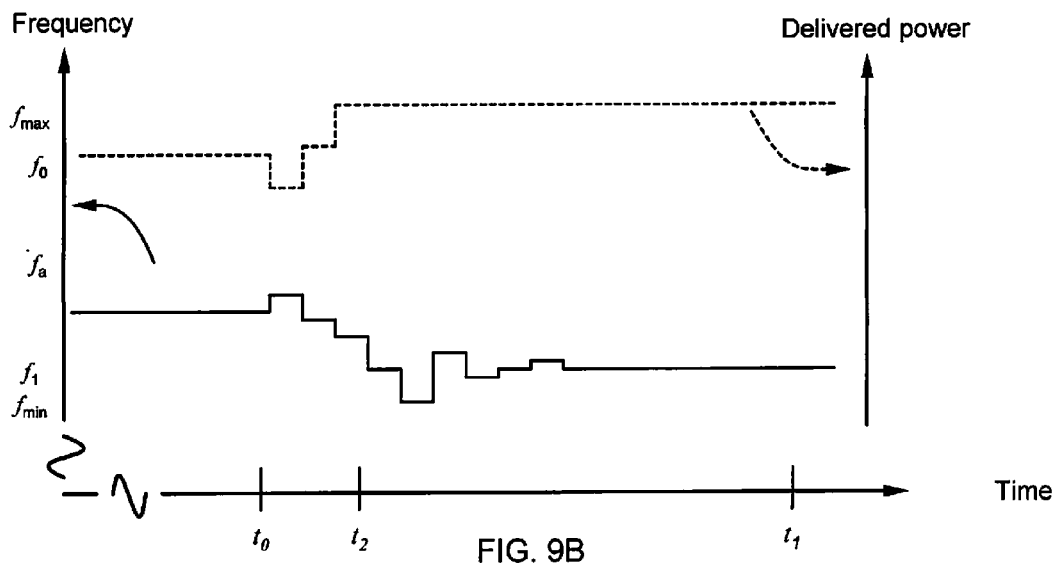
FIG. 9B is a graphical representation depicting how a primary power signal frequency may be adjusted to minimize the measure of performance depicted in FIG. 9A.
Figure 9C:
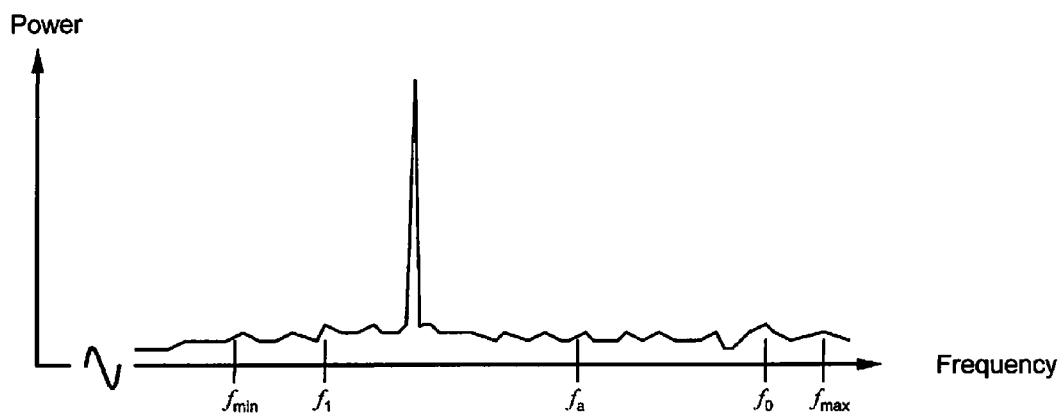
FIG. 9C depicts a spectrum (power per bandwidth, e.g., Watts per 3 kHz bandwidth) of the power generation system output at time t2 in FIG. 9B.

FIG. 9 depicts an aspect where an initial primary frequency may be applied between $f_1$ and $f_a$, and how a frequency tuning algorithm (that relies on sweeping and testing the frequency of the primary power) can become trapped in a local optimum of a measure of performance without the information provided by low power secondary signals. More specifically, a tuning algorithm can tune the primary frequency toward what is believed to be an optimum frequency at $f_1$. In particular, FIG. 9A shows a measure of performance (e.g., reflection coefficient) as a function of frequency; the solid line of FIG. 9B shows how an algorithm using only the primary power could adjust the primary power signal frequency to minimize the measure of performance; and FIG. 9C shows the spectrum (power per bandwidth, e.g., Watt per 3 kHz bandwidth) of the power generation system output 220, 320, 420, 520, 620 or 720 at time t2 in FIG. 9B. As shown by the dotted line in FIG. 9B, a global optimum frequency could be identified using low level secondary signals.

Figure 10A:
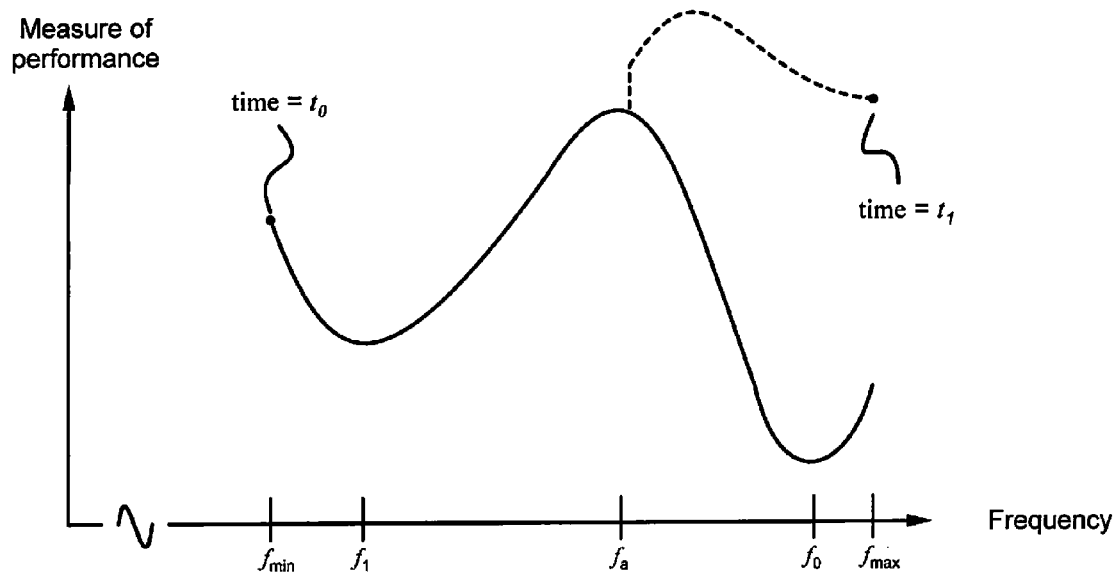
FIG. 10A is a graph depicting a measure of performance versus frequency.
Figure 10B:
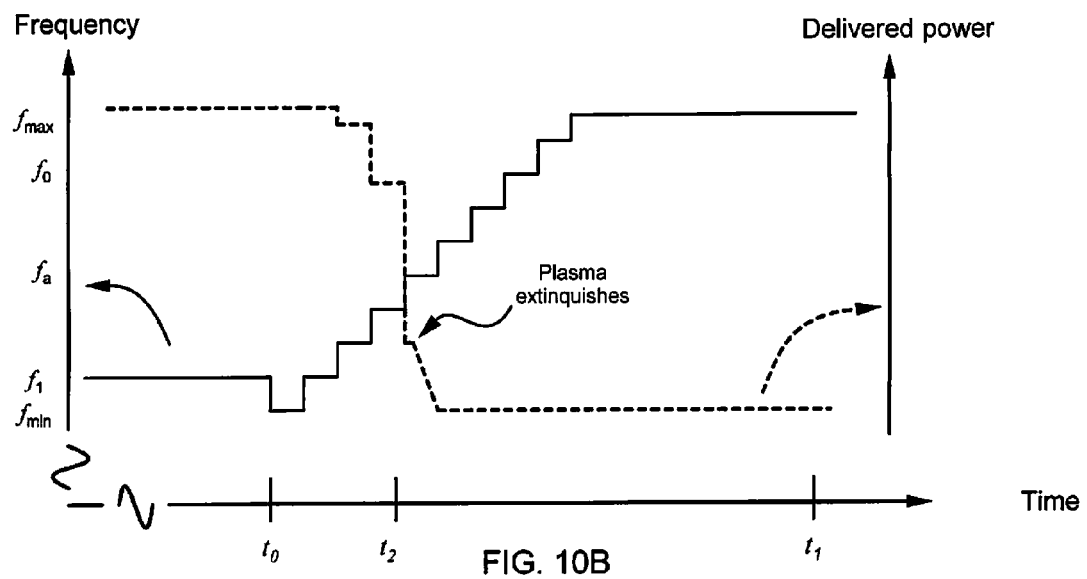
FIG. 10B is a plot depicting how a global search using the primary power signal can lead to an extinguished plasma.
Figure 10C:
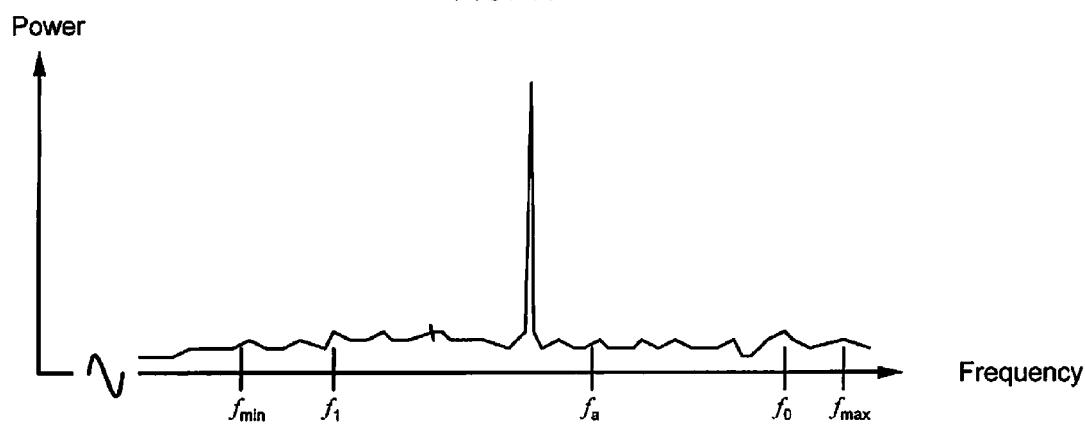
FIG. 10C is a graph showing a spectrum of the power generation system output at time t2 in FIG. 10B.

But as shown by the solid line, upon reaching that local optimum at $f_1$, if the primary frequency is used to search out the global optimum, such attempts might lead to application of power around the frequency $f_a$, which may result in extinguishing the plasma as seen in FIGS. 10A and 10B. FIG. 10A shows a measure of performance as a function of frequency. The solid line in FIG. 10A shows the measure of performance with a lit plasma, and the dotted line shows the measure of performance for an extinguished plasma. FIG. 10B shows how a global search using the primary power signal can lead to an extinguished plasma because not enough power can be delivered around $f_a$ to sustain the plasma. FIG. 10C shows the spectrum of the power generation system output at time t2 in FIG. 10B.

Instead, one or more secondary power signals can be used to search out the global optimum, as shown in FIG. 11 (showing one secondary power signal) and FIG. 12 (showing multiple secondary power signals), while the primary power signal remains at a fixed frequency (e.g., at or near a local optimum). In FIG. 11, shown is frequency tuning using a secondary power signal in the form of a low level signal at a single secondary frequency applied in a particular order. FIG. 12 shows frequency tuning using a secondary power signal in the form of a low level signal with spectral components at multiple secondary frequencies adjusted according to an algorithm to optimize a measure of performance.

As shown, the one or more secondary power signals can be applied at power levels far below that of the primary power signal and can be applied at one or more secondary frequencies. The secondary frequencies can be fixed frequencies with equal or unequal spacing, or can be variable frequencies as shown in FIG. 12. Further, the primary and secondary power signal(s) can be applied concurrently.

As illustrated in FIG. 11 the secondary signals can be applied continuously, or as illustrated in FIG. 12, only while searching for a global optimum. Further, while a single characteristic is shown in the plots of FIGS. 8-13, in other embodiments, multiple characteristics, e.g., load reflection coefficient magnitude together with plasma stability measured through (e.g., fluctuations in load impedance) can be simultaneously monitored and an analysis of all the monitored characteristics (or a plurality of the monitored characteristics) can be used to identify a global optimum. In this way, the global optimum is identified without applying the full power of the primary signal around $f_a$ or any frequencies that could extinguish the plasma.

In some modes of operation, the amplitude of the one or more secondary power signals applied at the one or more secondary frequencies is so small that it can be considered negligible in comparison to the primary power signal, and hence, does not have a significant influence on the plasma. In other applications, the amplitude of the secondary power signal or signals may be significant compared to the primary power signal if the goal is simply to not extinguish the plasma while searching for the global optimum. In such a case care must be taken not to exceed the voltage and current ratings of the plasma system because of high resulting amplitude at the beating frequencies.

FIG. 11 shows an embodiment where a single secondary frequency is continuously swept over a frequency range. The range over which the secondary frequency(s) is (are) swept would typically be the range of frequencies over which the power generation system is expected to operate (e.g. 12.882 to 14.238 MHz), but it does not have to be the case. Examples in which other frequency ranges can be considered include when information about the plasma condition is extracted using the secondary power signals by, for example, analyzing mixing and intermodulation products. In other cases as illustrated in FIG. 12, the secondary frequency or frequencies can be adjusted according to an algorithm to find the optimal frequency rather than sweep in a pre-determined pattern as shown in FIG. 11. Also as shown in FIG. 12, once a global optimum has been identified, the secondary power signals may be shut off rather than be applied continuously as shown in FIG. 11.

Figure 11A:
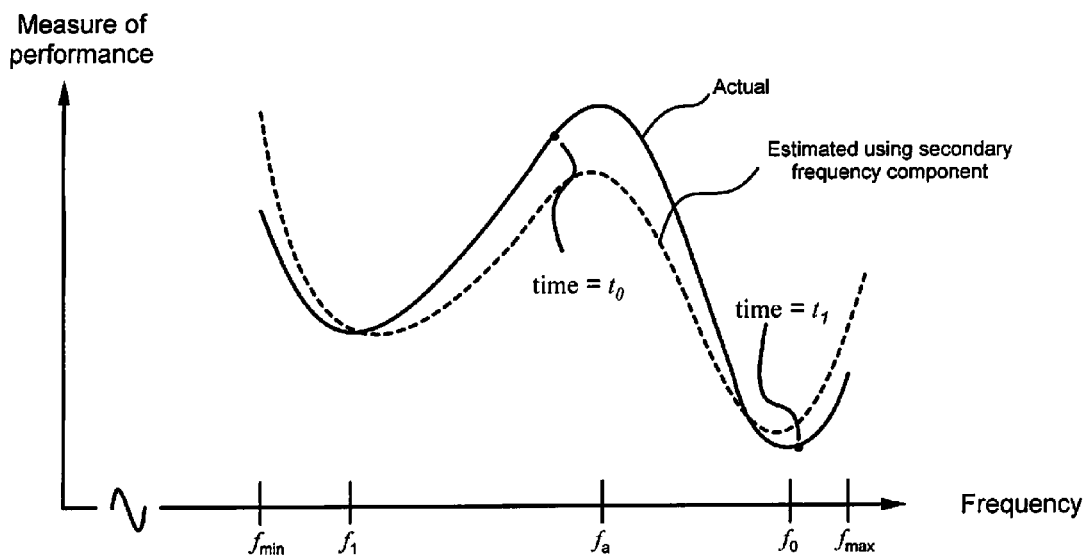
FIG. 11A is graph depicting an estimate of optimum frequency using a secondary power signal.
Figure 11B:
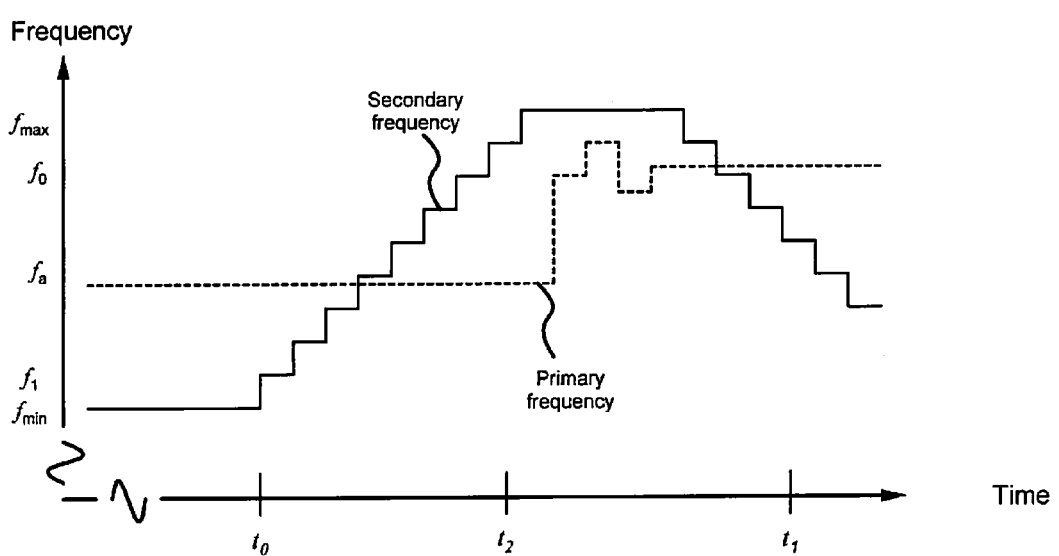
FIG. 11B is a graph depicting adjustment of a primary frequency after a determination of the desired frequency using a secondary power signals.
Figure 11C:
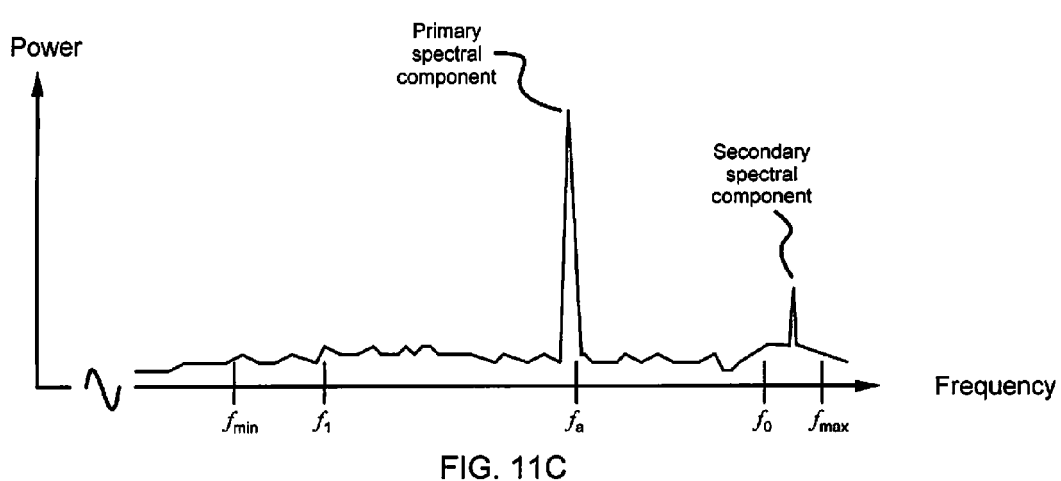
FIG. 11C is a graph showing spectral components of the power at the primary signal and the secondary signal of FIG. 11B.
Figure 12A:
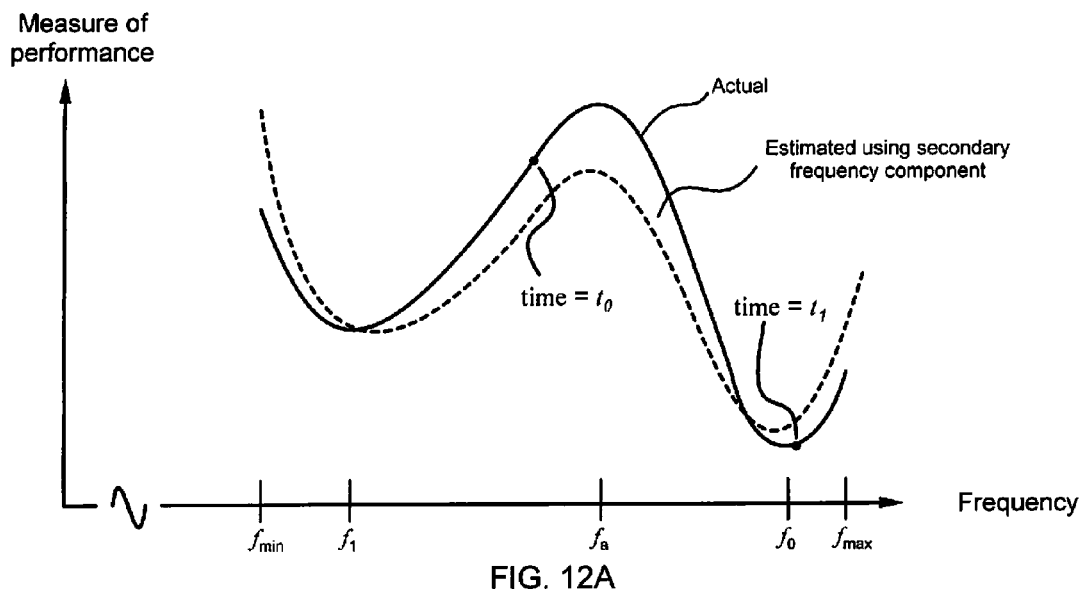
FIG. 12A is a graph depicting an estimate of optimum frequency using a secondary power signal.
Figure 12B:
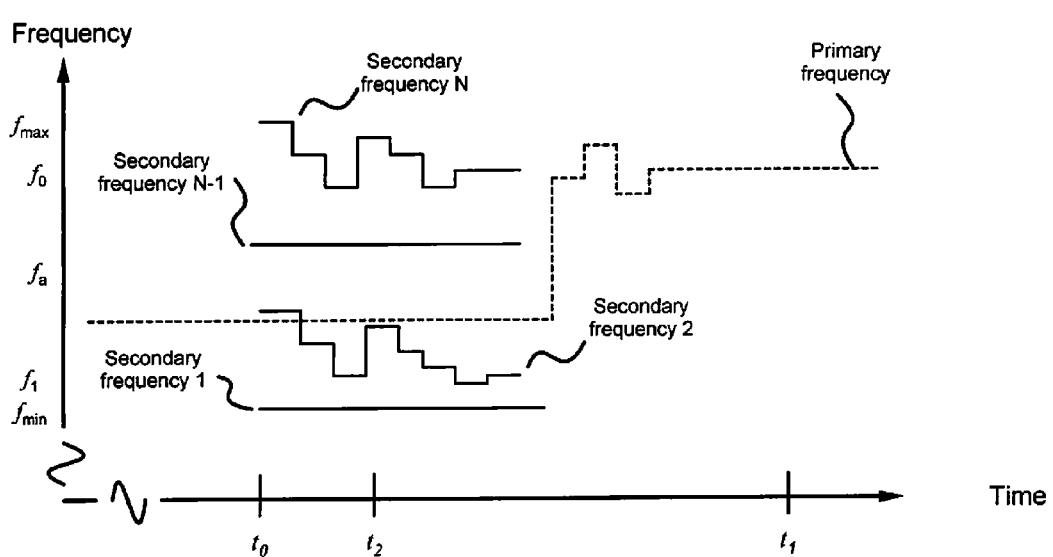
FIG. 12B is a graph depicting adjustment of a primary frequency after a determination of the desired frequency using secondary power signals.
Figure 12C:
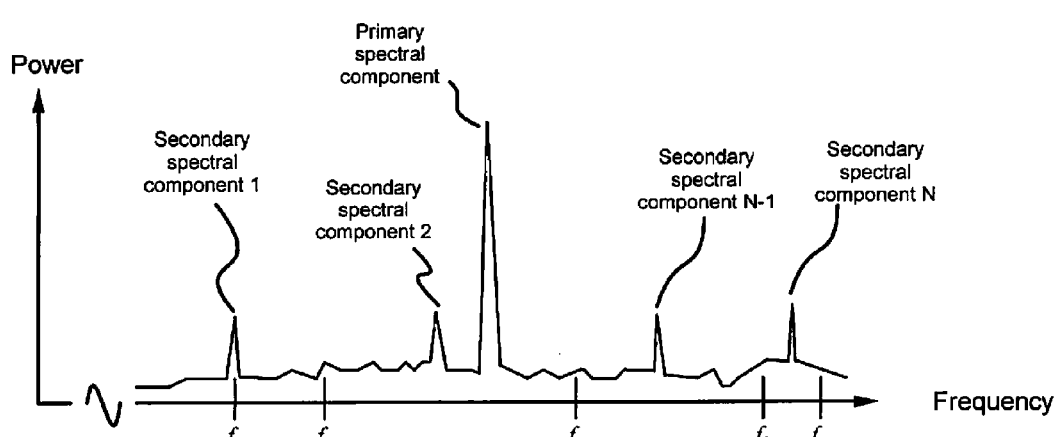
FIG. 12C is a graph depicting spectral components of the power at the primary signal and the secondary signals of FIG. 12B.
Figure 13A:
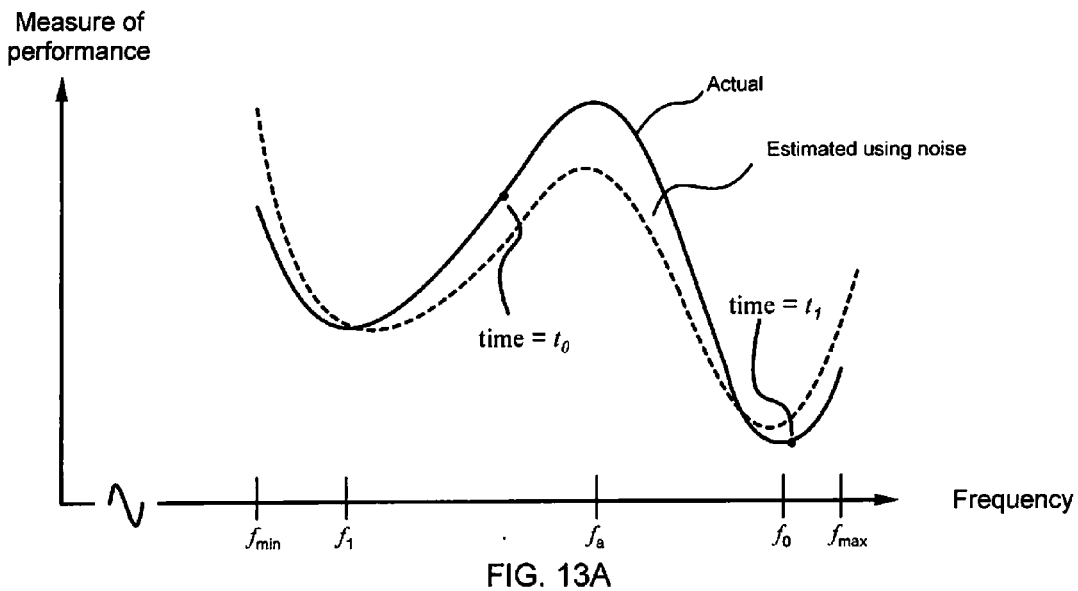
FIG. 13A is a graph depicting an estimate of optimum frequency using a secondary power signal.

As illustrated in FIG. 11A and FIG. 12A, the estimate of optimum frequency using the secondary power signal or signals may not correspond exactly to the true optimum. Typically such discrepancy would result from the nonlinear nature of the plasma load. As illustrated in FIG. 11B and FIG. 12B, following a determination of the optimum frequency using the secondary power signals, the primary frequency may be adjusted to further optimize performance. FIGS. 11C and 12C depict spectral components of the primary and secondary frequencies of FIGS. 11B and 11C, respectively.

Figure 13B:
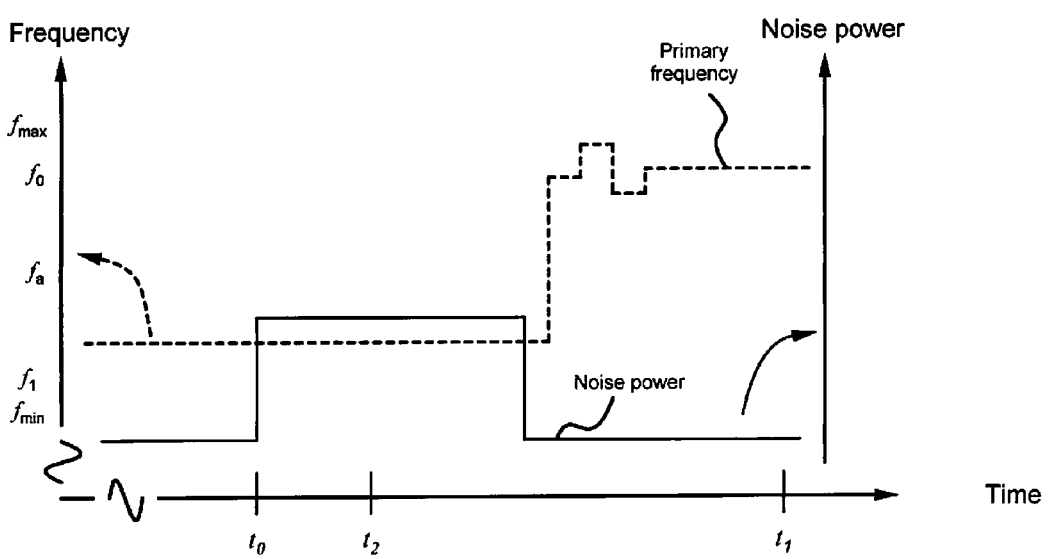
FIG. 13B is a graph depicting noise power as a function of time where noise is added to the power generation system output.
Figure 13C:
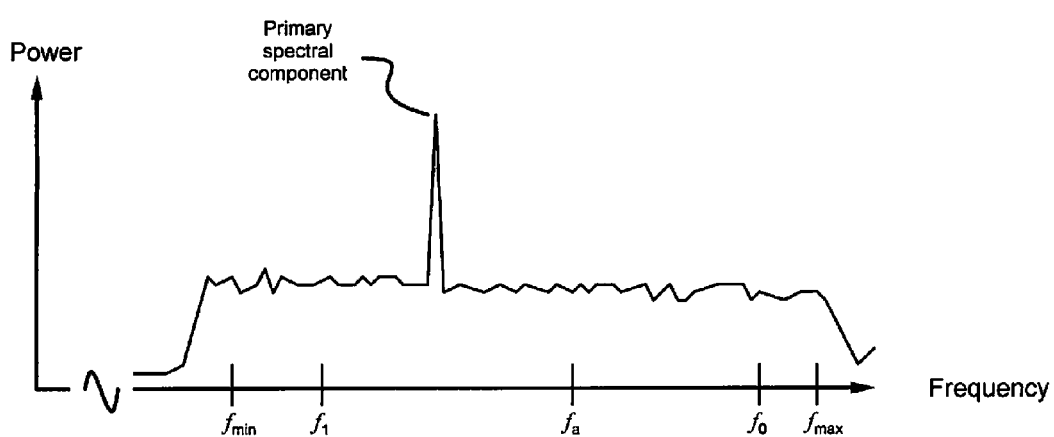
FIG. 13C is a graph depicting shows the spectrum of the power generation system output at time t2 in FIG. 13B.
Figure 14A:
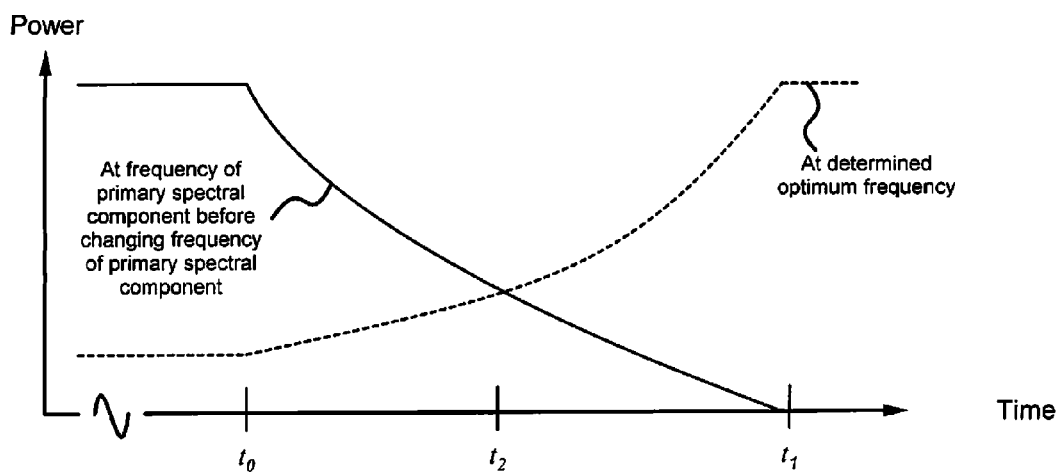
FIG. 14A is a graph depicting aspects of a method for frequency tuning.
Figure 14B:
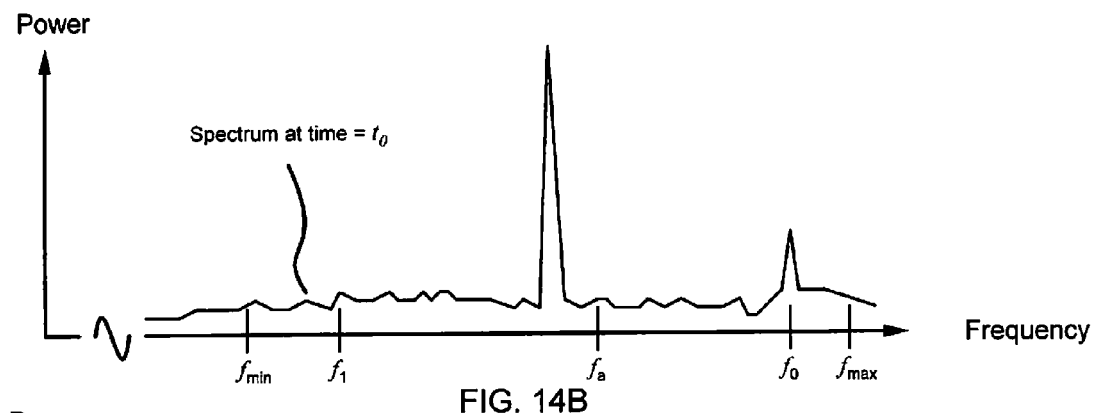
FIG. 14B is a graph depicting additional aspects of the method for frequency tuning shown in FIG. 14A.
Figure 14C:
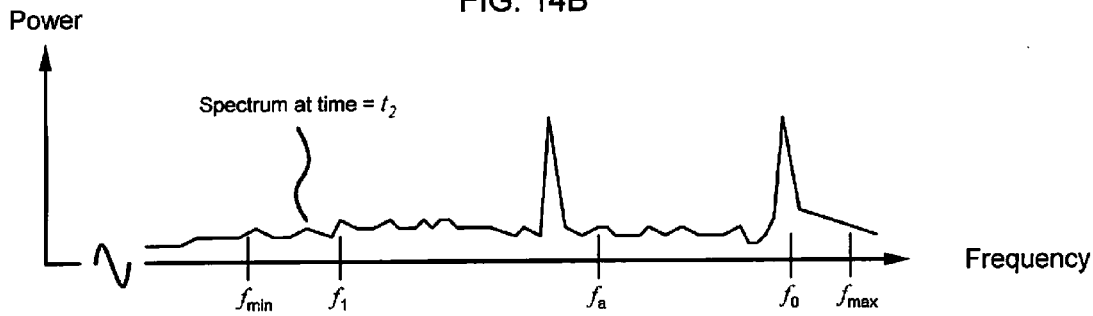
FIG. 14C is a graph depicting further aspects of the method for frequency tuning depicted in FIGS. 14A and 14B.
Figure 14D:
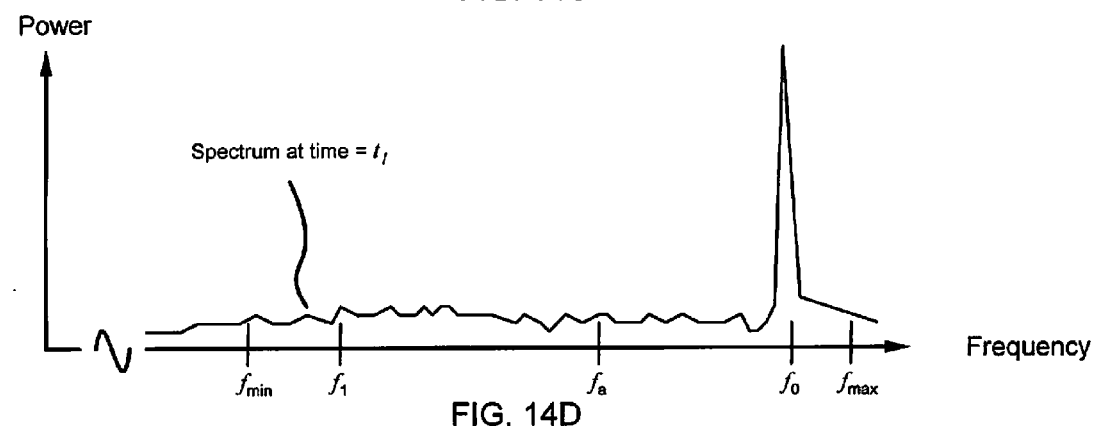
FIG. 14D is a graph depicting yet additional aspects of the method for frequency tuning depicted in FIGS. 14A, 14B, and 14C.

FIG. 13 shows the case where the secondary power signal is noise. FIG. 13C shows the spectrum of the power generation system output at time t2 in FIG. 13B. The noise can either be inherent to the primary power signal or can be added to the power generation system output (e.g., see FIGS. 6 and 7). FIG. 13B shows noise power as a function of time assuming the case where noise is added to the power generation system output.

Figure 15A:
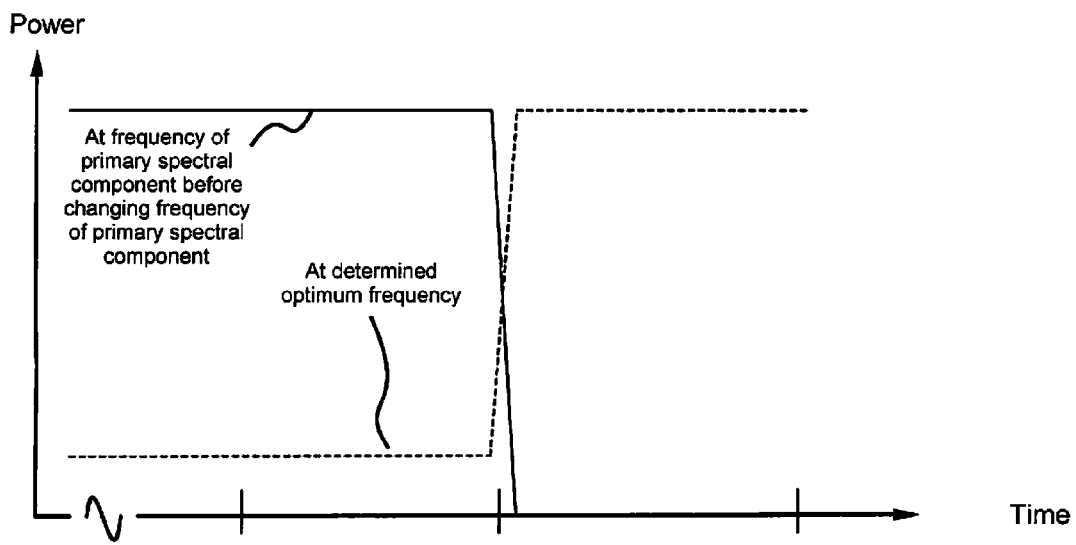
FIG. 15A is a graph depicting aspects of a method for frequency tuning.
Figure 15B:
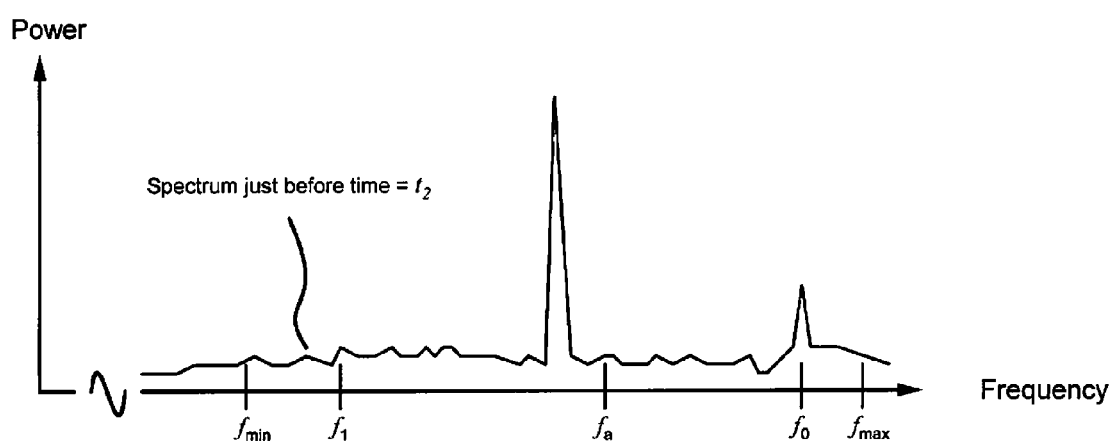
FIG. 15B is a graph depicting additional aspects of the method for frequency tuning depicted in FIG. 15A.
Figure 15C:
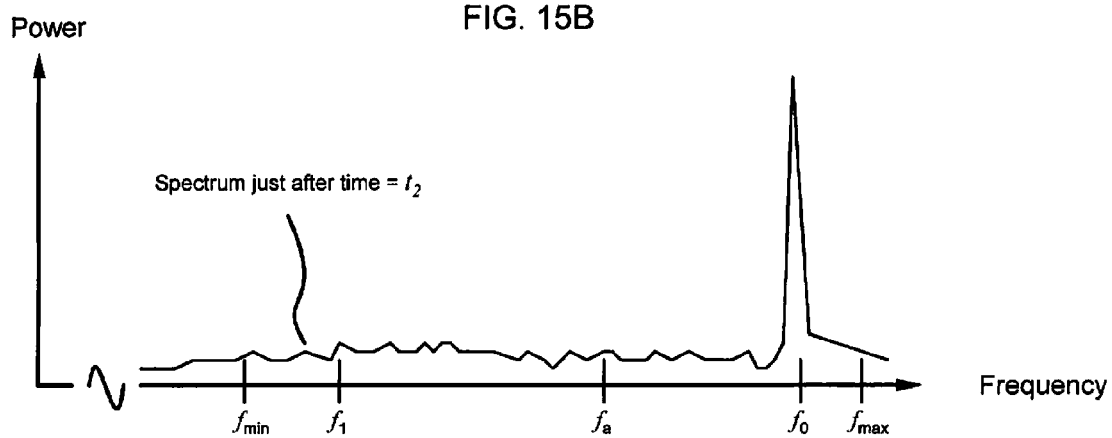
FIG. 15C is a graph depicting further aspects of the method for frequency tuning depicted in FIGS. 15A and 15B.

Once a global optimum has been identified, the primary power signal can be adjusted or switched to (or toward) the frequency corresponding to the global optimum without the primary power signal passing through regions of the frequency spectrum that could inhibit the plasma (e.g., near $f_a$). For instance, in FIG. 14, the primary power signal amplitude is ramped down while an amplitude of the secondary frequency at the global optimum is ramped up. In this way, the primary power signal and the secondary power signal switch places. FIG. 15 shows another variation of switching the primary frequency toward the global optimum, in which the frequency of the primary power signal is changed abruptly to the identified global optimum frequency.

In some embodiments, the identified global optimum frequency can be selected from one of the secondary frequencies, but this is not necessary. For instance, the identified global optimum frequency may be between two of the two or more secondary frequencies. For instance, interpolation between ones of the secondary frequencies can be used to identify the identified global optimum frequency.

Figure 16:
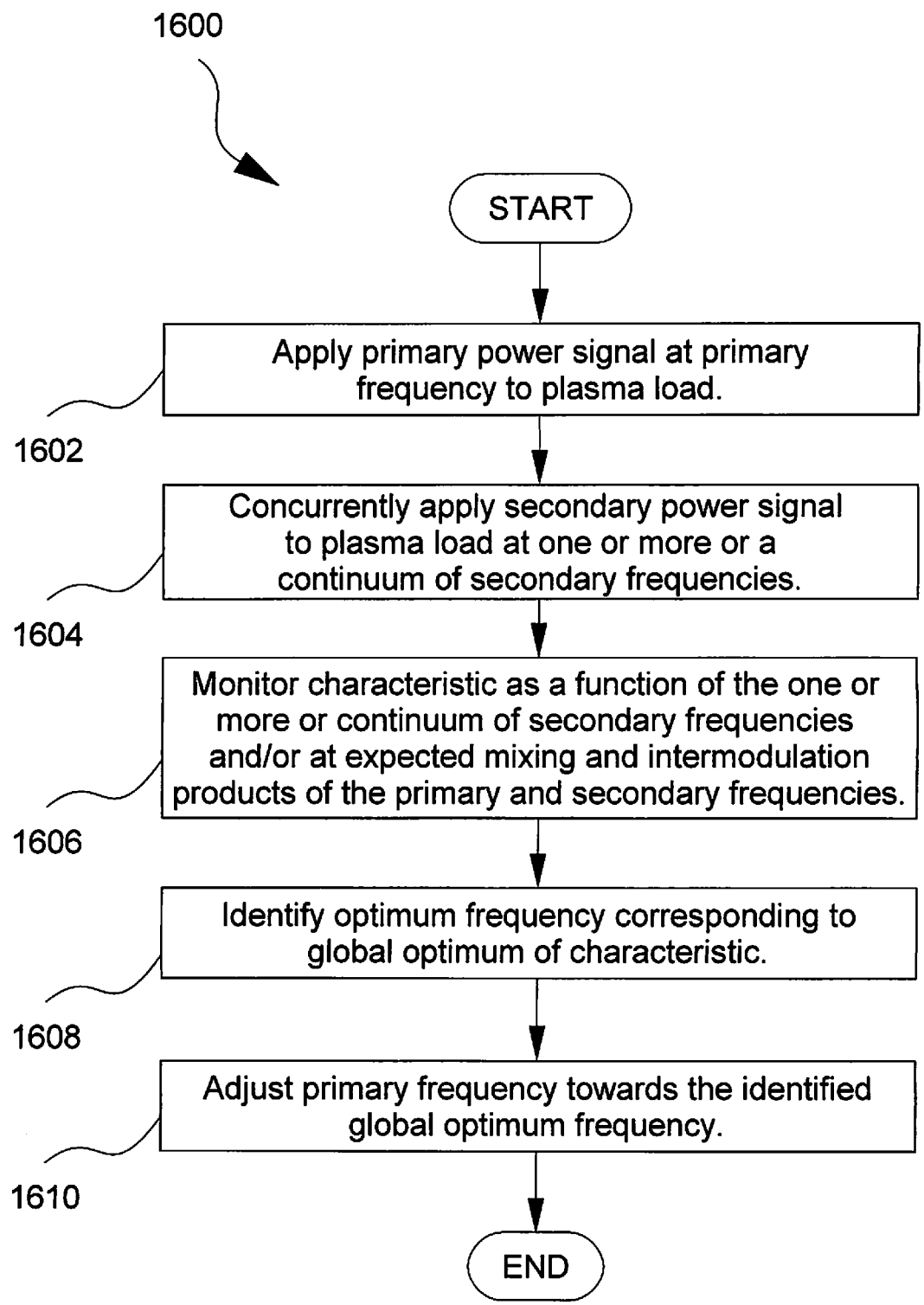
FIG. 16 illustrates a method for frequency tuning a power generation system that may be traversed in connection with embodiments described herein.

FIG. 16 illustrates a method for frequency tuning a power generation system to hone in on a global optimum of a measure of performance using a secondary power signal to find the global optimum. The method 1600 applies a primary power signal primarily at a primary frequency to a plasma system (e.g., matching network(s) 104 connected to a plasma chamber 108) (Block 1602). Concurrently, the method 1600 applies a low-level signal to the plasma system at one or more or a continuum (e.g., as in the case of noise) of secondary frequencies (Block 1604).

The low-level signal can be periodic or the sum of periodic signals, can be noise inherent to the primary power signal, or can be noise added to the primary power signal. The one or more secondary frequencies can be equally spaced in frequency or can have a varying spacing. The one or more secondary frequencies can be applied all at once or at separate times and can be adjusted over time. The one or more secondary frequencies can be swept across a fixed range of frequencies. Alternatively, the one or more secondary frequencies can be adjusted via feedback to probe for and hone in on a global optimum. The one or more secondary or continuum of secondary frequencies can be applied all the time or only while needed.

The method 1600 monitors a characteristic that is a measure of performance (e.g., load reflection coefficient magnitude) as a function of frequency, particularly at the one or more or continuum of secondary frequencies and/or at the primary frequency and/or at expected mixing and intermodulation products of the primary and secondary frequencies (Block 1606). The method 1600 then identifies an optimum frequency corresponding to a global optimum of the characteristic (Block 1608). This can be done via minimization and maximization algorithms familiar to those of skill in the art. Finally, the method 1600 adjusts the primary frequency of the primary power signal to the optimum frequency identified in the identifying operation (Block 1610). This adjustment can be made in a variety of ways. For instance, the adjustment may have to avoid applying primary power only in regions where reflected power approaches 100% (e.g., around $f_a$ in FIG. 8) for extended periods of time since this may extinguish the plasma (unless e.g. the plasma is sustained by another power source 150 or 151). So, the primary power signal can be switched to the optimum frequency or the power levels of the primary and secondary power signals can be gradually reversed such that the power signals reverse places, to name two non-limiting examples.

In some embodiments, the method 1600 ends when the primary power signal has been moved to a frequency identified as the global optimum using the secondary power signal or signals. However, in other instances, the method 1600 can loop to further refine the optimization or to account for changes to the global optimum due to e.g. the nonlinear nature of the plasma load or parameters that may change over time (e.g., plasma chamber gas pressure).

The identifying of an optimum frequency (Block 1608) can occur in real time as samples are obtained from the monitoring (Block 1606) or the analysis can occur after a range of frequencies has been sampled. The moving of the primary frequency (Block 1610) can occur only once the global optimum has been identified (Block 1608) or it can occur as soon as a more optimal frequency than the current primary frequency is identified.

The method of using a secondary power signal to monitor characteristics can also be used for the purpose of identifying plasma characteristics or changes in plasma characteristics. Instead of identifying an optimum frequency and adjusting the primary frequency towards the identified global optimum, the output or monitoring a characteristic (Block 1608) can be used to identify the plasma characteristics or changes in plasma characteristics. Monitoring mixing and intermodulation products can be used to monitor the nonlinear behavior of the plasma or simply to detect whether or not the plasma is lit. Rather than looking at particular mixing and intermodulation produces, higher order statistics (e.g., the bispectrum) can be used to identify plasma characteristics or changes in plasma characteristics.

Figure 17A:
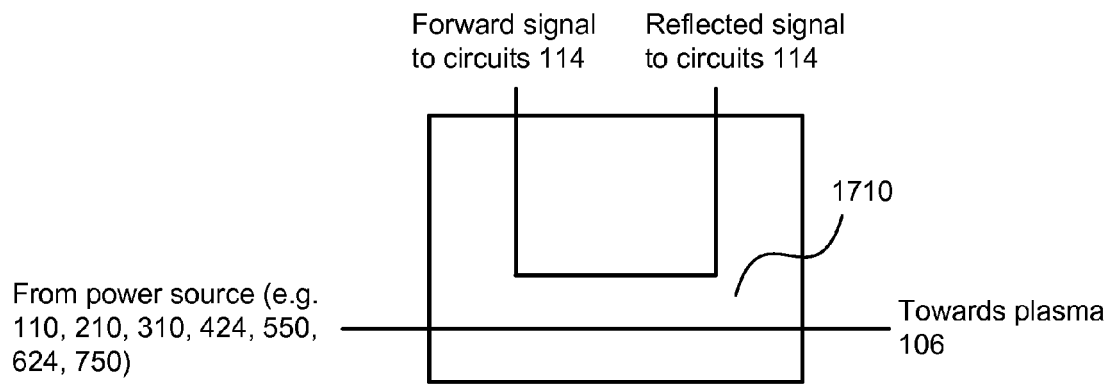
FIG. 17A is a diagram depicting an exemplary sensor.
Figure 17B:
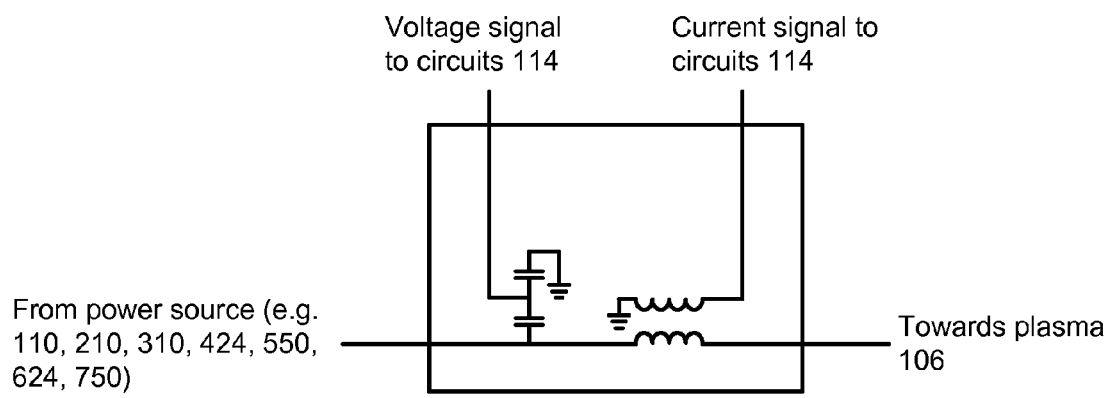
FIG. 17B is a diagram depicting another embodiment of a sensor.
Figure 17C:
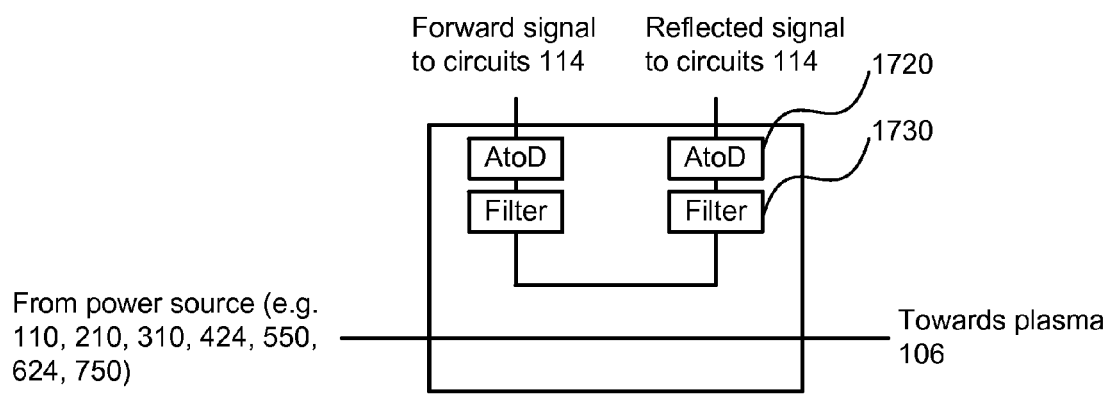
FIG. 17C is a diagram depicting yet another embodiment of a sensor.

FIG. 17 shows three exemplary implementations of the sensor e.g. sensor 112 or 412. The sensor can, e.g., be a directional coupler 1710 as shown in FIG. 17A or a voltage and current (VI) sensor as shown FIG. 17B, and either implementation can include a filter 1730 and analog to digital converter 1720 as shown FIG. 17C.

Figure 18:
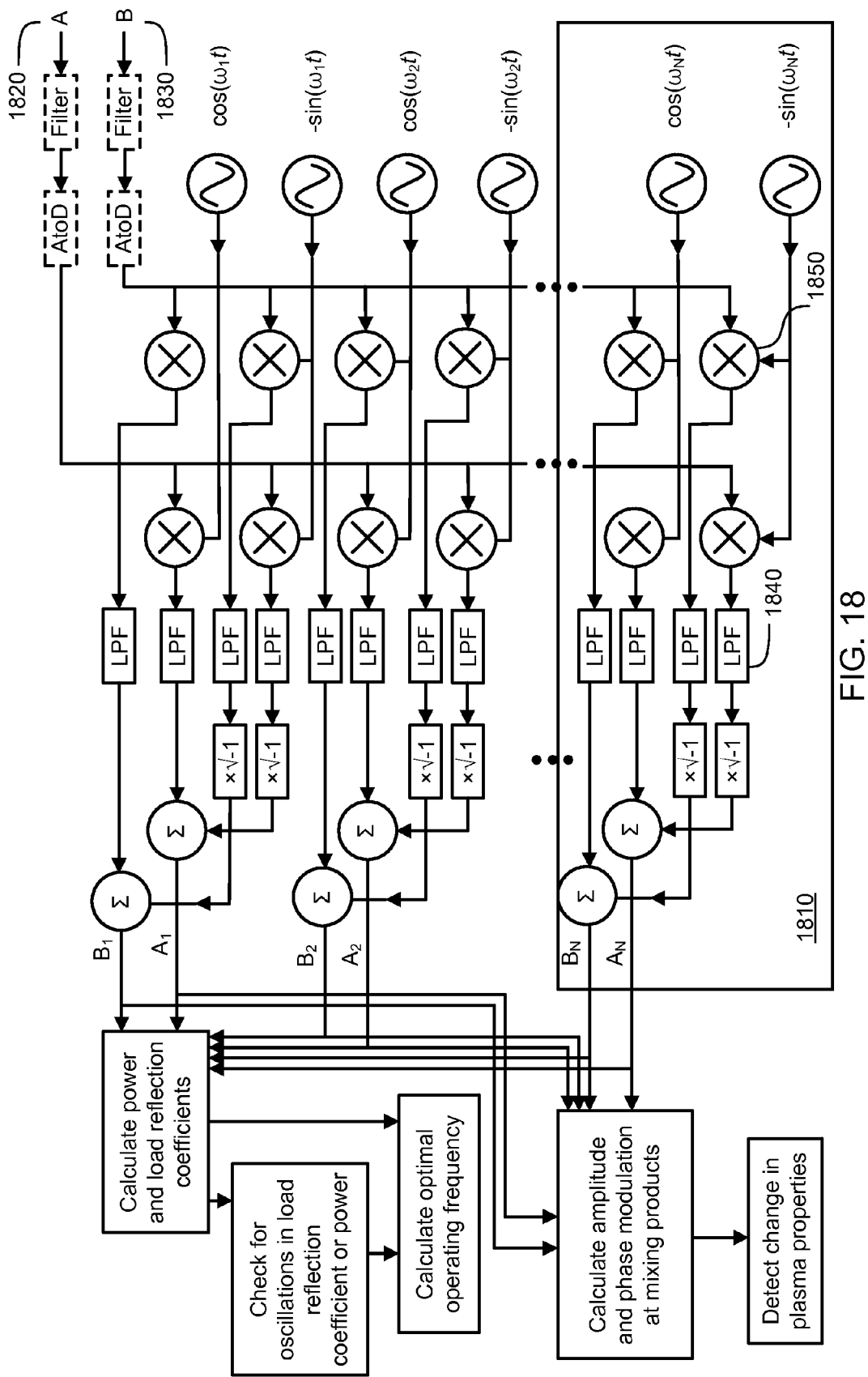
FIG. 18 is a diagram depicting aspects of an exemplary identification module.

FIG. 18 shows an exemplary implementation of the global optimum identification module (e.g., 116 or 418). Part of the functionality shown in FIG. 18 can also be part of the sensor. FIG. 18 shows an implementation using multiple demodulators 1810 allowing the processing of multiple frequency components at the same time. The signals 1820 (labeled A) and 1830 (labeled B) can, for example, be forward and reflected power or voltage and current or some other measurement of interest. After multiplication 1850 by cosine and sine functions and filtering 1840, complex vector representations of A and B at different frequencies labeled $A_1$, $B_1$ through $A_N$, $B_N$ are used in the calculation of power and load reflection coefficients at multiple frequencies. Typically one channel will be reserved for the primary frequency. The other channels can be set to the secondary frequency or frequencies or to expected mixing and intermodulation products. As noted before this is just one implementation and many other implementations using, for example, e.g., the discrete Fourier transform rather than dedicated demodulation channels are possible.

The illustrated arrangements of the components shown in FIGS. 1-7 are logical, the connections between the various components are exemplary only, and the depictions of these embodiments are not meant to be actual hardware diagrams; thus, the components can be combined or further separated in an actual implementation, and the components can be connected in a variety of ways without changing the basic operation of the systems.

Instead of a single secondary power source, as seen in FIGS. 4-7, two, three, four, or more secondary power sources could be used to generate two or more secondary power signals.

For the purposes of this disclosure, the secondary power signal can be periodic, for instance, an RF signal. However, in other embodiments, non-periodic power signals can be used (e.g. noise).

While this disclosure has repeatedly shown tuning for local and global minima, one of skill in the art will appreciate that tuning for local and global maxima is also envisioned and this disclosure can easily be applied to monitored characteristics where the primary frequency of the delivered power is optimized for a global maximum of a monitored characteristic.

Figure 19:
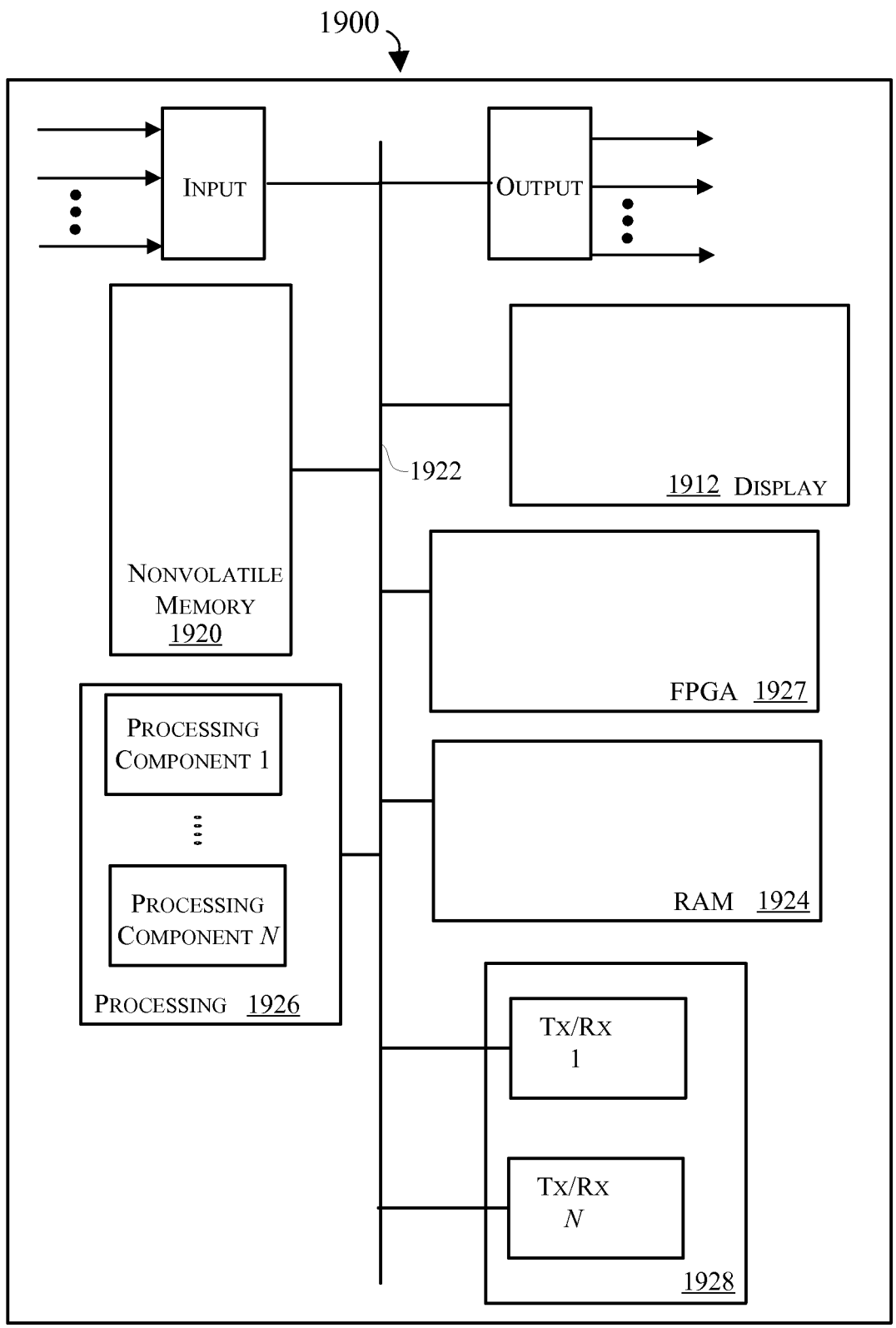
FIG. 19 is a block diagram depicting components that may be utilized to realize embodiments disclosed herein.

The methods described in connection with the embodiments disclosed herein may be embodied directly in hardware, in processor executable instructions encoded in non-transitory processor readable medium, or in a combination of the two. Referring to FIG. 19 for example, shown is a block diagram depicting physical components that may be utilized to realize the global optimum identification module 116 and the frequency control module 118 according to an exemplary embodiment. As shown, in this embodiment a display portion 1912 and nonvolatile memory 1920 are coupled to a bus 1922 that is also coupled to random access memory ("RAM") 1924, a processing portion (which includes N processing components) 1926, a field programmable gate array (FPGA) 1927, and a transceiver component 1928 that includes N transceivers. Although the components depicted in FIG. 19 represent physical components, FIG. 19 is not intended to be a detailed hardware diagram; thus many of the components depicted in FIG. 19 may be realized by common constructs or distributed among additional physical components. Moreover, it is contemplated that other existing and yet-to-be developed physical components and architectures may be utilized to implement the functional components described with reference to FIG. 19.

This display portion 1912 generally operates to provide a user interface for a user, and in several implementations, the display is realized by a touchscreen display. In general, the nonvolatile memory 1920 is non-transitory memory that functions to store (e.g., persistently store) data and processor executable code (including executable code that is associated with effectuating the methods described herein). In some embodiments for example, the nonvolatile memory 1920 includes bootloader code, operating system code, file system code, and non-transitory processor-executable code to facilitate the execution of a method described with reference to FIG. 16 and other methodologies described herein.

In many implementations, the nonvolatile memory 1920 is realized by flash memory (e.g., NAND or ONENAND memory), but it is contemplated that other memory types may be utilized as well. Although it may be possible to execute the code from the nonvolatile memory 1920, the executable code in the nonvolatile memory is typically loaded into RAM 1924 and executed by one or more of the N processing components in the processing portion 1926. The non-volatile memory 1920 or RAM 1924 may be utilized for storage of a frequency of the global optimum as described in FIGS. 8-14.

The N processing components in connection with RAM 1924 generally operate to execute the instructions stored in nonvolatile memory 1920 to enable the source impedance of a generator to be modified to achieve one or more objectives. For example, non-transitory processor-executable instructions to effectuate the methods described with reference to FIGS. 16 and 18 may be persistently stored in nonvolatile memory 1920 and executed by the N processing components in connection with RAM 1924. As one of ordinarily skill in the art will appreciate, the processing portion 1926 may include a video processor, digital signal processor (DSP), graphics processing unit (GPU), and other processing components. A DSP, for example, may be utilized in connection with embodiments that employ a discrete Fourier transform to analyze aspects of power at the generator output that are indicative of the plasma load.

In addition, or in the alternative, the FPGA 1927 may be configured to effectuate one or more aspects of the methodologies described herein (e.g., the method described with reference to FIGS. 16 and 18). For example, non-transitory FPGA-configuration-instructions may be persistently stored in nonvolatile memory 1920 and accessed by the FPGA 1927 (e.g., during boot up) to configure the FPGA 1927 to effectuate the functions of the global optimum identification module 116 and the frequency control module 118.

The input component operates to receive signals (e.g., the output signal from sensor 112, 312, 412, 413) that are indicative of one or more aspects of the output power and/or the plasma load. The signals received at the input component may include, for example, voltage, current, forward power, reflected power and plasma load impedance. It is contemplated that the input component may include both digital and analog inputs, and may include analog to digital conversion components to convert the analog signals to digital signals. The output component generally operates to provide one or more analog or digital signals to effectuate an operational aspect of the generator. For example, the output portion may provide a frequency control signal to the oscillators depicted and described herein. It is also contemplated that signals that control amplitude and phase of applied power may also be output from the output component.

The depicted transceiver component 1928 includes N transceiver chains, which may be used for communicating with external devices via wireless or wireline networks. Each of the N transceiver chains may represent a transceiver associated with a particular communication scheme (e.g., WiFi, Ethernet, Profibus, etc.). The transceiver component may be used, for example, to communicate with one or more other devices that are associated with a plasma processing tool.

Within this specification, the same reference characters are used to refer to terminals, signal lines, wires, etc. and their corresponding signals. In this regard, the terms "signal," "wire," "connection," "terminal," and "pin" may be used interchangeably, from time-to-time, within the this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A power generation system configured for identifying characteristics of a plasma load, the power generation system comprising:
   a power source configured to apply a primary power signal at a primary frequency to an output, the output configured for coupling to a plasma load, either directly or through a matching network, the power source concurrently applying one or more secondary power signals at one or more secondary frequencies to the output wherein power produced at the secondary frequencies is lower than power produced at the primary frequency, and wherein the power source is configured to combine the primary power signal and the one or more secondary power signals to provide a combined signal to the output before the combined signal is applied to the plasma load;
   a sensor arranged to monitor a characteristic of the power delivered to the plasma load;
   at least one circuit in communication with the sensor, the at least one circuit implementing;
   an identification module that analyzes the monitored characteristic to extract characteristics of the plasma load.

2. The system of claim 1, wherein power at the secondary frequencies is between 1 and 100 dB below power at the primary frequency.

3. The system of claim 1, wherein the sensor is a sensor selected from the group consisting of a voltage and current sensor and a directional coupler.

4. The system of claim 1, wherein the identification module is configured to analyze any changes in intermodulation products of the primary and secondary signals.

5. The system of claim 1, wherein the one or more secondary power signals is noise.

6. The system of claim 5, wherein the power source includes a single oscillator-amplifier combination to produce the primary power signal, and the noise is inherent to the single oscillator-amplifier combination.

7. The system of claim 1, wherein the power source includes a primary oscillator to generate the primary power signal and the secondary oscillator to generate the secondary power signals.

8. The system of claim 7, wherein the secondary oscillator is configured to inject a signal at a sideband frequency of the primary frequency, and wherein the identification module is configured to analyze an opposite sideband of the injected frequency.

9. The system of claim 8, wherein the secondary oscillator is configured to inject the sideband frequency at a frequency between 100 Hz and 100 kHz.

10. The system of claim 1, including at least one demodulation channel coupled to the sensor to obtain power information for at least one particular frequency.

11. A power generation system configured for identifying characteristics of a plasma load, the power generation system comprising:
    a power source to apply a primary power signal to an output at a primary frequency, the output configured to couple to a plasma load, either directly or through a matching network, the power source is configured to apply one or more secondary power signals at one or more secondary frequencies to the output, wherein power produced at the secondary frequencies is lower than power produced at the primary frequency, and wherein the power source is configured to combine the primary power signal and the one or more secondary power signals to provide a combined signal to the output before the combined signal is applied to the plasma load;
    a sensor arranged to sense power delivered to the plasma load;
    and identification module to provide information about the plasma load, the identification module including:
    a non-transitory, tangible machine readable storage medium, encoded with instructions to perform a method for providing the information about the plasma load, the method comprising:
    applying the primary power signal at a primary frequency to the plasma load;
    concurrently applying the one or more secondary power signals at the one or secondary frequencies to the plasma load; and
    analyzing the monitored characteristic to extract characteristics of the plasma load.

12. The power generation system of claim 11, wherein the machine readable storage medium includes instructions for sweeping the secondary frequencies across a fixed frequency range.

13. The power generation system of claim 11, wherein a spectrum of the secondary power signal includes a plurality of secondary frequencies at the same time.

14. The power generation system of claim 11, wherein the secondary power signal is tuned to different ones of a plurality of secondary frequencies at different times.

15. The power generation system of claim 11, wherein mixing and intermodulation products of the primary and secondary signals are analyzed to extract characteristics of the plasma load.

16. The power generation system of claim 11, wherein higher order statistics is used in analyzing the sensed power to extract characteristics of the plasma load.

17. The power generation system of claim 11, wherein higher order spectra is used in analyzing the characteristic to extract characteristics of the plasma load.

18. A power generation system configured for identifying characteristics of a plasma load, the power generation system comprising:
    an output configured for coupling to a plasma load, either directly or through a matching network;
    means for generating a primary power signal primarily at a primary frequency;
    means for concurrently generating one or more secondary power signals at, at least, one or more of secondary frequencies;
    means for combining the primary power signal and the one or more secondary power signals to provide a combined signal to the output before the combined signal is applied to the plasma load;
    means for monitoring a characteristic of the power delivered to the plasma load; and means for analyzing the monitored characteristic to extract characteristics of the plasma load.

19. The power generation system of claim 18, wherein power produced at the secondary frequencies is lower than power produced at the primary frequency.

20. The power generation system of claim 18, wherein power produced at the secondary frequencies is between 20 and 30 dB below power at the primary frequency.

21. The power generation system of claim 18, including means for sweeping the one or more secondary frequencies across a fixed frequency range.

22. The power generation system of claim 18, wherein a spectrum of the secondary power signal includes a plurality of secondary frequencies at a same time.

23. The power generation system of claim 18, wherein the secondary power signal is tuned to different ones of a plurality of secondary frequencies at different times.

24. The power generation system of claim 18, including means for wherein mixing and intermodulation products of the primary and secondary signals are analyzed to extract characteristics of the plasma load.

* * * * *